US011887690B2

(12) United States Patent
Vimercati

(10) Patent No.: US 11,887,690 B2
(45) Date of Patent: Jan. 30, 2024

(54) SIGNAL DEVELOPMENT CIRCUITRY LAYOUTS IN A MEMORY DEVICE

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

(*) Notice: Subject to any disclaimer, the term of this patent is extended or adjusted under 35 U.S.C. 154(b) by 116 days.

(21) Appl. No.: 17/680,006

(22) Filed: Feb. 24, 2022

(65) Prior Publication Data

US 2023/0267977 A1   Aug. 24, 2023

(51) Int. Cl.
*G11C 7/12* (2006.01)
*G11C 7/10* (2006.01)
*G11C 7/18* (2006.01)

(52) U.S. Cl.
CPC .............. *G11C 7/12* (2013.01); *G11C 7/1039* (2013.01); *G11C 7/18* (2013.01)

(58) Field of Classification Search
CPC ............ G11C 7/12; G11C 7/1039; G11C 7/18
USPC .......... 365/244, 149, 185.21, 185.23, 185.27
See application file for complete search history.

(56) References Cited

U.S. PATENT DOCUMENTS

| | | | |
|---|---|---|---|
| 10,032,496 B1 | 7/2018 | Bedeschi | |
| 10,163,480 B1 | 12/2018 | Kawamura et al. | |
| 11,705,185 B2 * | 7/2023 | Vimercati | G11C 11/4091 365/185.21 |
| 2020/0234747 A1 * | 7/2020 | Redaelli | G11C 5/02 |

* cited by examiner

*Primary Examiner* — Connie C Yoha
(74) *Attorney, Agent, or Firm* — Holland & Hart LLP

(57) ABSTRACT

Methods, systems, and devices for signal development circuitry layouts in a memory device are described. A memory device may include signal development circuitry that is positioned in multiple levels of a memory die relative to a substrate. For example, a set of first transistors used for developing access signals may be located on a first level of a memory die, and a set of second transistors used for developing the access signals may be located on a second level of the memory die. Formation of the set of first transistors and the set of second transistors may involve processing operations that are common with the formation of other transistors on a respective level, such as cell selection transistors, deck selection transistors, shunting transistors, and other transistors of the respective level.

25 Claims, 9 Drawing Sheets

410

SIGNAL DEVELOPMENT CIRCUITRY LAYOUTS IN A MEMORY DEVICE

FIELD OF TECHNOLOGY

The following relates to one or more systems for memory, including signal development circuitry layouts in a memory device.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
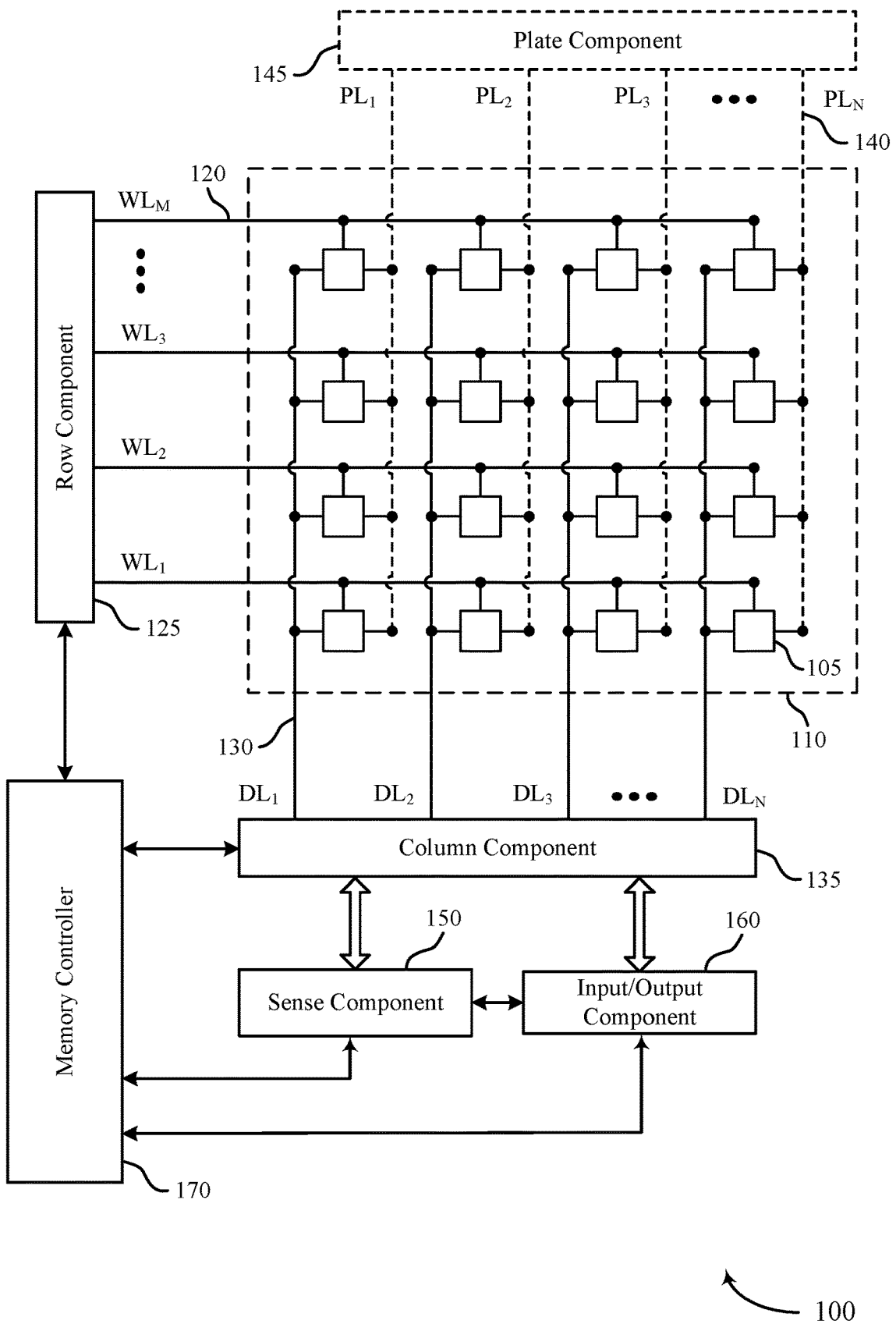
FIG. 1 illustrates an example of a memory device that supports signal development circuitry layouts in accordance with examples as disclosed herein.

Memory devices may include various arrangements of memory arrays formed over a substrate, and memory cells of the memory arrays may be organized (e.g., addressed) according to rows and columns. In some examples, at least some of the circuitry that supports operating (e.g., accessing) the memory arrays may be located below the memory arrays, which may refer to a location that is at least in part between the memory arrays and the substrate. For example, decoding or multiplexing circuitry, signal development circuitry, or sensing circuitry, among other types of circuitry, may be located below the memory arrays and, in some examples, may include transistors that are formed at least in part by doping portions of the substrate (e.g., substrate-based transistors, such as transistors having channels formed from doped crystalline silicon or other semiconductors). As memory devices scale to have a greater quantity of levels (e.g., layers, decks) above a substrate, an area of a substrate used for such supporting circuitry may increase, which may lead to scaling limitations (e.g., related to the limited area of a substrate to support a growing quantity of decks and, by extension, a growing quantity and area for such supporting circuitry).

In accordance with examples as disclosed herein, a memory device may include signal development circuitry that is positioned in multiple levels of a memory die relative to a substrate. For example, a set of one or more first transistors of signal development circuitry and used for developing access signals may be located on a first level of a memory die, and a set of one or more second transistors of the signal development circuitry and used for developing the access signals may be located on a second level of the memory die. In some examples, the set of first transistors may be coupled with a set of access lines (e.g., at the first level), and may be associated with coupling the set of access lines with a voltage source, such as a ground voltage source. In some examples, the set of second transistors may be coupled with the set of access lines (e.g., at the second level), and may be associated with providing a voltage shift along the access lines, which may support a sense amplifier comparing the access signals relative to a voltage, such as a ground voltage. Such operation of the second set of transistors may leverage a capacitance of the second set of transistors (e.g., between a gate of a second transistor and a channel of the second transistor, between a gate of a second transistor and a respective access line), and may involve both ends of a channel of a second transistor being coupled (e.g., directly, indirectly) with a respective access line. Formation of the set of first transistors and the set of second transistors may involve processing operations that are common with the formation of other transistors on a respective level, such as cell selection transistors, deck selection transistors, shunting transistors, and other transistors of the respective level. By configuring signal development circuitry, which may include signal development transistors, to be located on multiple levels of a memory die, and leveraging common manufacturing operations, the memory die may support a higher density of memory cells (e.g., in each level), improved access operations (e.g., due to shorter access lines, due to closer proximity between memory cells and signal development circuitry), and greater scalability (e.g., by supporting greater quantities of levels above a substrate), among other benefits.

Features of the disclosure are initially described in the context of a memory device and related circuitry as described with reference to FIGS. 1 through 4. Features of the disclosure are described in the context of an example circuit, timing diagram, and memory structure as described with reference to FIGS. 5 through 7. These and other features of the disclosure are further illustrated by and described with reference to an apparatus diagram and flowchart that relate to signal development circuitry layouts in a memory device as described with references to FIGS. 8 and 9.

FIG. 1 illustrates an example of a memory device 100 that supports signal development circuitry layouts in a memory device in accordance with examples as disclosed herein. The memory device 100 may also be referred to as a memory die or an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., in a capacitor, in a capacitive memory element, in a capacitive storage element). In some examples, a charged and uncharged capacitor may represent two logic states, respectively. In some other examples, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive, dielectric) layer between terminals of the capacitor. Different levels or polarities of polarization of a ferroelectric capacitor may represent different logic states (e.g., supporting two or more logic states in a respective memory cell 105).

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A selected memory cell 105 (e.g., a target memory cell 105) may be a memory cell 105 located at the intersection of selected word line 120 (e.g., an activated word line 120, an energized word line 120) and a selected digit line 130 (e.g., an activated digit line 130, an energized digit line 130).

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130, which may be referred to as activating the one or more memory cells 105 or coupling the one or more memory cells 105 with a respective one or more digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). For configurations in which a memory cell 105 employs a capacitor for storing a logic state, a digit line 130 may provide access to a first node (e.g., a first terminal, a first plate) the capacitor, and a plate line 140 may provide access to a second node (e.g., a second terminal, a second plate) of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer, a common plate node).

Access operations such as reading, writing, rewriting, and refreshing may be performed on a memory cell 105 by selecting (e.g., activating) a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and a resulting flow of charge via an access line or a resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate a corresponding word line 120 based on the received row address.

Similarly, a column component 135 may receive a column address from the memory controller 170 and activate a corresponding digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set or subset of digit lines 130 coupled with the sense component 150. For example, a sense component 150 may include a separate sensing circuit (e.g., a respective sense amplifier, a respective signal development component) for each of a set of digit lines 130 coupled with the sense component 150, such that a logic state may be separately detected for a respective memory cell 105 coupled with a respective one of the set of digit lines 130.

A memory cell 105 may be written to by activating the relevant word line 120, digit line 130, or plate line 140 (e.g., via a memory controller 170). In other words, a logic state may be stored in a memory cell 105. A row component 125, column component 135, or plate component 145 may accept data, for example, via input/output component 160, to be written to the memory cells 105. A write operation may be performed at least in part by a sense component 150, or a write operation may be configured to bypass a sense component 150.

In configurations implementing a capacitive memory element, a memory cell 105 may be written by applying a voltage to (e.g., across) a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied to the ferroelectric memory element (e.g., grounding, virtually grounding, or equalizing a voltage across the ferroelectric memory element).

In accordance with examples as disclosed herein, the memory device 100 may include signal development circuitry (e.g., associated with a sense component 150) that is positioned in multiple levels of a memory die (e.g., a semiconductor die) relative to a substrate. For example, a set of one or more first transistors used for developing access signals may be located on a first level of the memory die, and a set of one or more second transistors used for developing the access signals may be located on a second level of the memory die. Formation of the set of first transistors and the set of second transistors may involve processing operations (e.g., patterning operations, material deposition operations, material removal operations) that are common with the formation of other transistors on a respective level, such as cell selection transistors, deck selection transistors, shunting transistors, and other transistors of the respective level. By positioning signal development transistors on multiple levels of a memory die, and leveraging common manufacturing operations, the memory device 100 may support a higher density of memory cells 105 (e.g., in each level), improved access operations (e.g., due to shorter access lines, due to closer proximity between memory cells 105 and signal development circuitry), and greater scalability (e.g., by supporting greater quantities of levels above a substrate), among other benefits.

Figure 2:
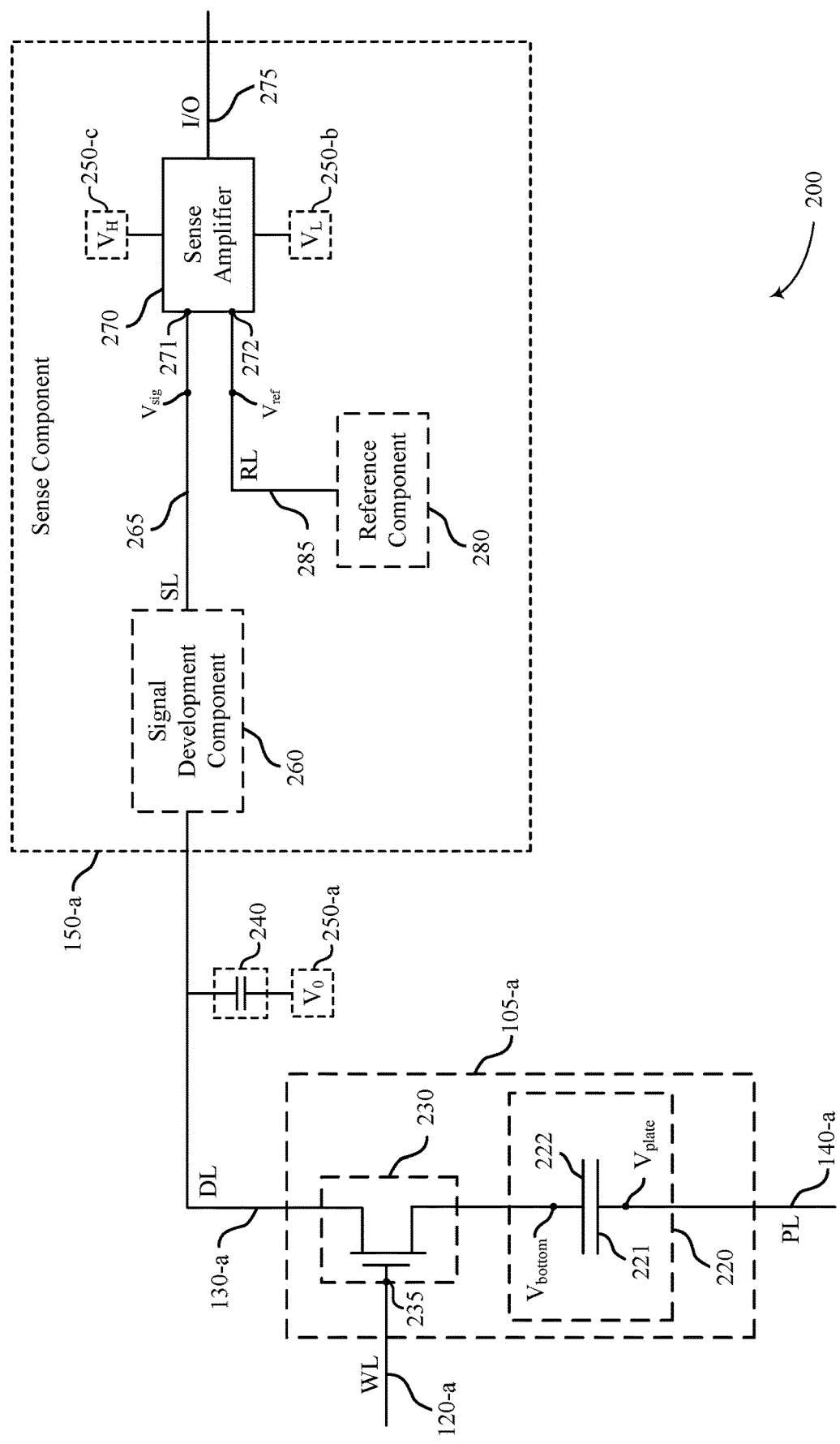
FIG. 2 illustrates an example of a circuit that supports signal development circuitry layouts in a memory device in accordance with examples as disclosed herein.

FIG. 2 illustrates an example of a circuit 200 that supports signal development circuitry layouts in a memory device in accordance with examples as disclosed herein. The circuit 200 includes a memory cell 105-*a* and a sense component 150-*a*, which may be examples of the respective components as described with reference to FIG. 1. Circuit 200 also includes a word line 120-*a*, a digit line 130-*a*, and a plate line 140-*a*, which may be examples of the respective access lines described with reference to FIG. 1. In various examples, the plate line 140-*a* may be illustrative of an independently-addressable plate line 140-*a*, or a common plate node (e.g., of a memory array 110 that includes the memory cell 105-*a*). In some memory architectures (e.g., DRAM), the plate line 140-*a* may be an example of a ground node, such as Vss. In some other memory architectures (e.g., FeRAM), the plate line 140-*a* may be biased to different voltage levels during different portions of operations performed using the memory cell 105-*a*.

The memory cell 105-*a* may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The cell plate 221 may be accessed via the plate line 140-*a* and cell bottom 222 may be accessed via the digit line 130-*a*. As described herein, various logic states may be stored by charging, discharging, or polarizing the capacitor 220.

The capacitor 220 may be electrically connected with the digit line 130-*a*, and the stored logic state of the capacitor 220 may be read or sensed by operating various elements represented in circuit 200. For example, the memory cell 105-*a* may also include a cell selection component 230 which, in some examples, may be referred to as a switching component or a selector device coupled with or between an access line (e.g., the digit line 130-*a*) and the capacitor 220. In some examples, a cell selection component 230 may be considered to be outside the illustrative boundary of the memory cell 105-*a*, and the cell selection component 230 may be referred to as a switching component or selector device coupled with or between an access line (e.g., the digit line 130-*a*) and the memory cell 105-*a*.

The capacitor 220 may be coupled (e.g., selectively) with the digit line 130-*a* when the cell selection component 230 is activated (e.g., by way of an activating logical signal), and the capacitor 220 can be isolated (e.g., selectively) from the digit line 130-*a* when the cell selection component 230 is deactivated (e.g., by way of a deactivating logical signal). A logical signal or other selection signal or voltage may be applied to a control node 235 of the cell selection component 230 (e.g., via the word line 120-*a*). In other words, the cell selection component 230 may be configured to couple or decouple the capacitor 220 and the digit line 130-*a* based on a logical signal or voltage applied via the word line 120-*a* to the control node 235.

Activating the cell selection component 230 may be referred to as selecting or activating the memory cell 105-*a*, and deactivating the cell selection component 230 may be referred to as deselecting or deactivating the memory cell 105-*a*. In some examples, the cell selection component 230 is a transistor and its operation may be controlled by applying an activation voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor. In some examples, activating the cell selection component 230 may be referred to as coupling (e.g., selectively) the memory cell 105-*a* with the digit line 130-*a*.

Biasing the plate line 140-*a* or the digit line 130-*a* may result in a voltage difference (e.g., the voltage of the digit line 130-*a* minus the voltage of the plate line 140-*a*) across the capacitor 220. The voltage difference may accompany a change in the charge stored by the capacitor 220 (e.g., due to charge sharing between the capacitor 220 and the digit line 130-*a*, due to charge sharing between the capacitor 220 and the plate line 140-*a*), and the magnitude of the change in stored charge may depend on the initial state of the capacitor 220 (e.g., whether the initial charge or logic state stored a logic 1 or a logic 0).

The digit line 130-*a* may be coupled with additional memory cells 105 (not shown), and the digit line 130-*a* may have properties that result in a non-negligible intrinsic capacitance 240 (e.g., on the order of picofarads (pF)), which may couple the digit line 130-*a* with a voltage source 250-*a*. The voltage source 250-*a* may represent a common ground or virtual ground voltage, or the voltage of an adjacent access line of the circuit 200 (not shown). Although illustrated as a separate element in FIG. 2, the intrinsic capacitance 240 may be associated with properties distributed throughout the digit line 130-*a*.

The sense component 150-*a* may include a signal development component 260 and a sense amplifier 270 coupled with the signal development component 260 via a signal line 265. In various examples, the signal development component 260 may include circuitry configured to amplify or otherwise modify signals of the digit line 130-*a* before a logic state detection operation (e.g., by the sense amplifier 270). The signal development component 260 may include, for example, a transistor, an amplifier, a cascode, or any other circuitry configured to develop a signal for sensing a logic state stored by the memory cell 105-*a*. In some examples, the signal development component 260 may include a charge transfer sensing amplifier, which may include one or more transistors in a cascode or voltage control configuration.

Although the digit line 130-*a* and the signal line 265 are identified as separate lines, the digit line 130-*a*, the signal line 265, and any other lines connecting a memory cell 105 with a sense amplifier 270 may be referred to as a single access line (e.g., of or associated with the memory cell 105). Constituent portions of such an access line may be identified separately for the purposes of illustrating intervening components and intervening signals in various example configurations.

The sense amplifier 270 may include a first node 271 and a second node 272 which, in some examples, may be coupled with different access lines of a circuit (e.g., a signal line 265 and a reference line 285 of the circuit 200, respectively) or, in other examples, may be coupled with a common access line of a different circuit (not shown). In some examples, the first node 271 may be referred to as a signal node, and the second node 272 may be referred to as a reference node. However, other configurations of access lines or reference lines may be used to support the techniques described herein.

The sense amplifier 270 may include various transistors or amplifiers to detect, convert, or amplify a difference in signals, which may be referred to as latching. For example, the sense amplifier 270 may include circuit elements that receive and compare a sense signal voltage (e.g., $V_{sig}$, of the signal line 265) at a first node 271 with a reference signal voltage (e.g., $V_{ref}$, of a reference line 285) at a second node 272. A voltage of the first node 271 may be based on accessing the memory cell 105-*a*, such as a voltage based at least in part on a charge transfer of the capacitor 220 while the cell selection component 230 is activated. In some examples, a voltage of the second node 272 may be provided by a reference component 280 (e.g., a reference voltage source). In some other examples, a reference voltage may be provided, for example, by accessing the memory cell 105-*a* to generate the reference voltage (e.g., in a self-referencing access operation), or by accessing a different memory cell 105 (e.g., a complementary memory cell 105) to generate the reference voltage (e.g., in a paired or complementary memory cell access operation), in which case at least a portion of the reference component 280 may be included as part of a signal development component 260, or at least a portion of the reference component 280 may be omitted. For example, the second node 272 may be coupled (e.g., selectively) with the signal line 265, the signal development component 260, and the digit line 130-*a* (e.g., for a self-referencing configuration), or the second node 272 may be coupled with a different signal line 265 and a different signal development component 260 of the sense component 150, which may be coupled with a different digit line 130 coupled with a different memory cell 105 (e.g., for a complementary referencing configuration).

An output of the sense amplifier 270 may be driven to a relatively higher voltage (e.g., a positive voltage) or a relatively lower voltage (e.g., a negative voltage, a ground voltage) based on the comparison at the sense amplifier 270. For example, the sense amplifier 270 may output a detected logic state via one or more I/O lines 275 based on a comparison of signals at the first node 271 and the second node 272. For example, if the first node 271 has a lower voltage than the second node 272, an output of the sense amplifier 270 may be driven to a relatively lower voltage of a first sense amplifier voltage source 250-b (e.g., a voltage of $V_L$, which may be a ground voltage substantially equal to $V_0$ or a negative voltage). If the first node 271 has a higher voltage than the second node 272, an output of the sense amplifier 270 may be driven to the voltage of a second sense amplifier voltage source 250-c (e.g., a voltage of $V_H$). The sense component 150-a may latch the output of the sense amplifier 270 to determine the logic state stored in the memory cell 105-a (e.g., latching or determining a logic 0 when the first node 271 has a lower voltage than the second node 272, latching or determining a logic 1 when the first node 271 has a higher voltage than the second node 272). The latched output of the sense amplifier 270, corresponding to the detected logic state of memory cell 105-a, may be output via one or more input/output (I/O) lines (e.g., I/O line 275), which may include an output through a column component 135 or an input/output component 160 described with reference to FIG. 1. In some examples, one or more I/O lanes may share a common electrical node or path with the first node 271 or the second node 272.

To perform a write operation on the memory cell 105-a, a voltage may be applied across the capacitor 220 by controlling the voltage of the cell plate 221 (e.g., through the plate line 140-a) and the cell bottom 222 (e.g., through the digit line 130-a). For example, to write a logic 0, the cell plate 221 may be taken low (e.g., grounding the plate line 140-a, virtually grounding the plate line 140-a, applying a negative voltage to the plate line 140-a), and the cell bottom 222 may be taken high (e.g., applying a positive voltage to the digit line 130-a). The opposite process may be performed to write a logic 1, where the cell plate 221 is taken high and the cell bottom 222 is taken low. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220.

The circuit 200, including the sense amplifier 270, the cell selection component 230, the signal development component 260, or the reference component 280, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., a drain terminal and the source terminal, across a conduction channel).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In some examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying drain and source voltages. For example, the applied voltage at the gate terminal may have a particular voltage level (e.g., a clamping voltage) that is used to enable conductivity between the drain terminal and the source terminal when the source terminal voltage is below a certain level (e.g., below the gate terminal voltage minus the threshold voltage). When the voltage of the source terminal rises above the certain level, the n-type transistor may be deactivated such that the conductive path between the drain terminal and source terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., a drain terminal and the source terminal, across a conductive channel).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying drain and source voltages. For example, the applied voltage at the gate terminal may have a particular voltage level that is used to enable conductivity between the drain terminal and the source terminal so long as the source terminal voltage is above a certain level (e.g., above the gate terminal voltage plus the threshold voltage). When the voltage of the source terminal voltage falls below the certain level, the p-type transistor may be deactivated such that the conductive path between the drain terminal and source terminal is opened.

A transistor of the circuit 200 may be a field-effect transistor (FET), including a metal oxide semiconductor FET, which may be referred to as a MOSFET. In some examples, these and other types of transistors may be formed by doped regions of material of a substrate. In some examples, the transistor(s) may be formed on a substrate that is dedicated to a particular component of the circuit 200 (e.g., a substrate for the sense amplifier 270, a substrate for the signal development component 260, a substrate for the reference component 280, a substrate for the memory cell 105-*a*), or the transistor(s) may be formed on a substrate that is common for particular components of the circuit 200 (e.g., a substrate that is common to two or more of the sense amplifier 270, the signal development component 260, the reference component 280, or the memory cell 105-*a*). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

Although the circuit 200 illustrates a set of components relative to a single memory cell 105, various components of the circuit 200 may be duplicated in a memory device 100 to support various operations. For example, to support row access or page access operations, a sense component 150 may be configured with multiples of one or more of a signal development component 260, a signal line 265, a reference component 280, a reference line 285, a sense amplifier 270, or other components, where the multiples may be configured according to a quantity of memory cells 105 that may be accessed in a row access or page access operation (e.g., in a concurrent operation).

In accordance with examples as disclosed herein, the circuit 200 may include signal development circuitry (e.g., circuitry of a signal development component 260, circuitry of a reference component 280) that is positioned in multiple levels of a memory die relative to a substrate. For example, a set of one or more first transistors used for developing access signals may be located on a first level of a memory die, and a set of one or more second transistors used for developing the access signals may be located on a second level of the memory die. In some examples, the set of first transistors may be coupled with a set of access lines (e.g., coupled with a set of signal lines 265 at the first level), and may be associated with coupling the set of access lines with a voltage source, such as a ground voltage source. In some examples, the set of second transistors may be coupled with the set of access lines (e.g., coupled with the set of signal lines 265 at the second level), and may be associated with providing a voltage shift along the access lines, which may support a sense amplifier 270 comparing the access signals relative to a voltage, such as a ground voltage.

In some examples, the first transistors and the second transistors may include respective channel portions that are formed from doped semiconductor materials that have been deposited above a semiconductor substrate (e.g., using thin film material deposition techniques), and transistors of the sense amplifier 270 may include respective channel portions that are formed from doped regions of a semiconductor substrate (e.g., doped regions of a crystalline silicon wafer). Formation of the set of first transistors and the set of second transistors may involve processing operations that are common with the formation of other transistors on a respective level, such as cell selection transistors, deck selection transistors, shunting transistors, and other transistors of the respective level. By positioning signal development transistors on multiple levels of a memory die, and leveraging common manufacturing operations, the memory die may support a higher density of memory cells (e.g., in each level), improved access operations (e.g., due to shorter access lines, due to closer proximity between memory cells and signal development circuitry), and greater scalability (e.g., by supporting greater quantities of levels above a substrate), among other benefits.

Figure 3A:
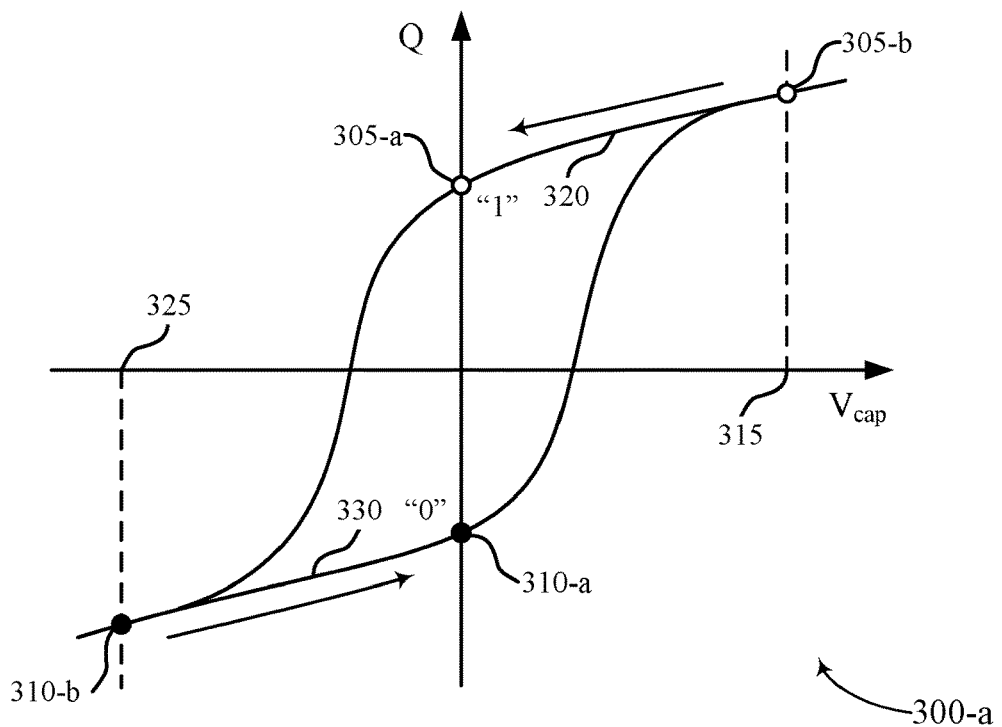
FIGS. 3A and 3B illustrate examples of non-linear electrical properties of a ferroelectric memory cell in accordance with examples as disclosed herein.
Figure 3B:
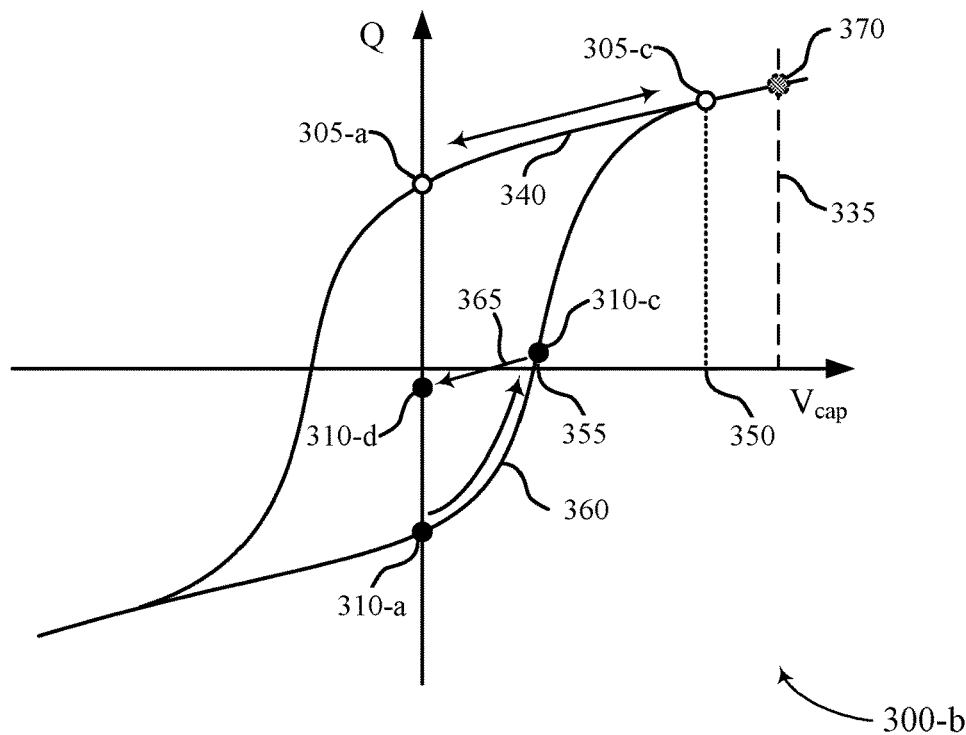

FIGS. 3A and 3B illustrate examples of non-linear electrical properties of a ferroelectric memory cell with hysteresis plots 300-*a* and 300-*b* in accordance with examples as disclosed herein. The hysteresis plots 300-*a* and 300-*b* may illustrate aspects of a writing process and a reading process, respectively, for a memory cell 105 employing a ferroelectric capacitor 220 as described with reference to FIG. 2. The hysteresis plots 300-*a* and 300-*b* depict the charge, Q, stored on a ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a cell bottom 222 and a cell plate 221 (e.g., $V_{bottom}-V_{plate}$, $V_{DL}-V_{PL}$). However, in some other examples, $V_{cap}$ may alternatively be understood as a difference between a cell plate 221 and a cell bottom 222 (e.g., $V_{plate}-V_{bottom}$, $V_{PL}-V_{DL}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals.

As depicted in the hysteresis plot 300-*a*, a ferroelectric material used in a ferroelectric capacitor 220 may maintain a positive or negative polarization during conditions in which there is no net voltage difference between the terminals of the ferroelectric capacitor 220. For example, the hysteresis plot 300-*a* illustrates two possible polarization states, a charge state 305-*a* and a charge state 310-*a*, which may represent a negatively saturated polarization state and a positively saturated polarization state, respectively. The charge states 305-*a* and 310-*a* may be at a physical condition illustrating remnant polarization (Pr) values, which may refer to the polarization (or charge) that remains upon removing an external bias (e.g., voltage). According to the example of the hysteresis plot 300-*a*, the charge state 305-*a* may represent a logic 1 when no voltage difference is applied across the ferroelectric capacitor 220, and the charge state 310-*a* may represent a logic 0 when no voltage difference is applied across the ferroelectric capacitor 220. In some examples, the logic values of the respective charge states or polarization states may be reversed or interpreted in an opposite manner to accommodate other schemes for operating a memory cell 105.

A logic 0 or 1 may be written to the memory cell 105 by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-*b* is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-*b* and the charge state 305-*a* at zero voltage across the capacitor. In other words, charge state 305-*a* may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 may result in charge accumulation until the charge state 310-*b* is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-*b* and the charge state 310-*a* at zero voltage across the capacitor. In other words, charge state 310-*a* may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220. Although the example of hysteresis plot 300-*a* illustrates a logic 0 corresponding to charge state 310-*a*, and a logic 1 corresponding to charge state 305-*a*, logic states may correspond to different charge states in some examples, such as a logic 0 corresponding to charge state 305-*a* and a logic 1 corresponding to charge state 310-*a*, among other examples.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-*a*, or the charge state 310-*a*, or some other charge state was initially stored, among other factors.

The hysteresis plot 300-*b* illustrates an example for reading stored charge states 305-*a* and 310-*a*. A read voltage 335 may be applied, for example, as a voltage difference via a digit line 130-*a* and a plate line 140-*a* as described with reference to FIG. 2. The hysteresis plot 300-*b* may illustrate read operations where the read voltage 335 is positive voltage difference $V_{cap}$ (e.g., where $V_{bottom}-V_{plate}$ is positive, where $V_{DL}$ is greater than $V_{PL}$). A positive read voltage across the ferroelectric capacitor 220 may be referred to as a "plate low" read operation, where a digit line 130-*a* is taken initially to a high voltage, and a plate line 140-*a* is initially at a low voltage (e.g., a ground voltage). Although the read voltage 335 is shown as a positive voltage across the ferroelectric capacitor 220, in alternative access operations a read voltage may be a negative voltage across the ferroelectric capacitor 220, which may be referred to as a "plate high" read operation.

The read voltage 335 may be applied across the ferroelectric capacitor 220 while a memory cell 105 is selected (e.g., by activating a cell selection component 230 via a word line 120-*a* as described with reference to FIG. 2). Upon applying the read voltage 335 to the ferroelectric capacitor 220, charge may flow into or out of the ferroelectric capacitor 220 via the associated digit line 130-*a* and plate line 140-*a*, and, in some examples, different charge states or access line voltages may result depending on whether the ferroelectric capacitor 220 was at the charge state 305-*a* (e.g., storing a logic 1) or at the charge state 310-*a* (e.g., storing a logic 0), or some other charge state.

When performing a read operation on a ferroelectric capacitor 220 at the charge state 305-*a* (e.g., a logic 1), additional positive charge may accumulate across the ferroelectric capacitor 220, and the charge state may follow path 340 until reaching the charge and voltage of the charge state 305-*c*. The amount of charge flowing through the capacitor 220 may be related to the intrinsic or other capacitance of the digit line 130-*a* or other access line. In a "plate low" read configuration, a read operation associated with the charge states 305-*a* and 305-*c*, or more generally a read operation associated with the logic 1 state, may be associated with a relatively small amount of charge transfer (e.g., compared to a read operation associated with the charge states 310-*a* and 310-*c*, or more generally the logic 0 state).

As shown by the transition between the charge state 305-*a* and the charge state 305-*c*, the resulting voltage 350 across the ferroelectric capacitor 220 may be a relatively large positive value due to the relatively large change in voltage at the capacitor 220 for the given change in charge. Thus, upon reading a logic 1 in a "plate low" read operation, the digit line voltage, equal to the sum of $V_{PL}$ and $V_{cap}$ (e.g., $V_{bottom}-V_{plate}$) at the charge state 305-*c*, may be a relatively high voltage. Such a read operation may not change the remnant polarization of the ferroelectric capacitor 220 that stored the charge state 305-*a*, and thus after performing the read operation the ferroelectric capacitor 220 may return to the charge state 305-*a* via path 340 when the read voltage 335 is removed (e.g., by applying a zero net voltage across the ferroelectric capacitor 220, by equalizing the voltage across the ferroelectric capacitor 220). Thus, performing a read operation with a positive read voltage on a ferroelectric capacitor 220 with a charge state 305-*a* may be considered a non-destructive read process.

When performing the read operation on the ferroelectric capacitor 220 at the charge state 310-*a* (e.g., a logic 0), the stored charge may reverse polarity as a net positive charge accumulates across the ferroelectric capacitor 220, and the charge state may follow the path 360 until reaching the charge and voltage of the charge state 310-*c*. The amount of charge flowing through the ferroelectric capacitor 220 may again be related to the intrinsic or other capacitance of the digit line 130-*a* or other access line. In a "plate low" read configuration, a read operation associated with the charge states 310-*a* and 310-*c*, or more generally a read operation associated with the logic 0 state, may be associated with a relatively large amount of charge transfer (e.g., compared to a read operation associated with the charge states 305-*a* and 305-*c*, or more generally the logic 1 state).

As shown by the transition between the charge state 310-*a* and the charge state 310-*c*, the resulting voltage 355 may, in some cases, be a relatively small positive value due to the relatively small change in voltage at the capacitor 220 for the given change in charge. Thus, upon reading a logic 0 in a "plate low" read operation, the digit line voltage, equal to plate, the sum of $V_{PL}$ and $V_{cap}$ (e.g., $V_{bottom}-V_{plate}$) at the charge state 310-*c*, may be a relatively low voltage.

The transition from the charge state 310-*a* to the charge state 310-*d* may be illustrative of a sensing operation that is associated with a partial reduction or partial reversal in polarization or charge of a ferroelectric capacitor 220 of a memory cell 105 (e.g., a reduction in the magnitude of charge Q from the charge state 310-*a* to the charge state 310-*d*). In other words, according to the properties of the ferroelectric material, after performing the read operation the ferroelectric capacitor 220 may not return to the charge state 310-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation of the charge state 310-*a* with read voltage 335, the charge state may follow path 365 from the charge state 310-*c* to the charge state 310-*d*, illustrating a net reduction in polarization magnitude (e.g., a less positively polarized charge state than initial charge state 310-*a*, illustrated by the difference in charge between the charge state 310-*a* and the charge state 310-*d*). Thus, performing a read operation with a positive read voltage on a ferroelectric capacitor 220 with a charge state 310-*a* may be described as a destructive read process.

The position of the charge state 305-*c* and the charge state 310-*c* after initiating a read operation may depend on various factors, including the specific sensing scheme and circuitry. In some cases, the final charge may depend on the net capacitance of a digit line 130-*a* coupled with the memory cell 105, which may include an intrinsic capacitance 240, an integrator capacitor (e.g., of a sense component 150), and others. For example, if a ferroelectric capacitor 220 is electrically coupled with a plate line 140-*a* at 0V and the read voltage 335 is applied to a digit line 130-*a*, the voltage of the digit line 130-*a* may fall when the memory cell 105 is selected due to charge flowing from the net capacitance of the digit line 130-*a* to the ferroelectric capacitor 220. Thus, in some examples, a voltage measured at a sense component 150 may not be equal to the read voltage 335, or the resulting voltages 350 or 355, and instead may depend on the voltage of the digit line 130-*a* or other access line following a period of charge sharing.

The initial state (e.g., charge state, logic state) of the ferroelectric capacitor 220 may be determined by comparing the voltage of a digit line 130-*a*, or signal line 265 where applicable, resulting from the read operation with a reference voltage (e.g., via a reference line 285 as described with reference to FIG. 2). In some examples, the digit line voltage may be the sum of the plate line voltage and the final voltage across the ferroelectric capacitor 220 (e.g., voltage 350 when reading the ferroelectric capacitor 220 having a stored charge state 305-*a*, or voltage 355 when reading the ferroelectric capacitor 220 having a stored charge state 310-*a*). In some examples, the digit line voltage may be the difference between the read voltage 335 and the final voltage across the capacitor 220 (e.g., (read voltage 335-voltage 350) when reading the ferroelectric capacitor 220 having a stored charge state 305-*a*, (read voltage 335-voltage 355) when reading the ferroelectric capacitor 220 having a stored charge state 310-*a*).

In some examples, read operations of a memory cell 105 may be associated with a fixed voltage of a digit line 130-*a*, where a charge state of a ferroelectric capacitor 220 after initiating a read operation may be the same regardless of its initial charge state. For example, in a read operation where a digit line 130-*a* is held at a fixed read voltage 335, the ferroelectric capacitor 220 may proceed to a charge state 370 for both the case where the ferroelectric capacitor initially stored a charge state 305-*a* and the case where the ferroelectric capacitor initially stored a charge state 310-*a*. Accordingly, rather than using a difference in voltage of a digit line 130-*a* to detect an initial charge state or logic state, in some examples, the initial charge state or logic state of the ferroelectric capacitor 220 may be determined based at least in part on the difference in charge associated with the read operation. For example, as illustrated by hysteresis plot 300-*b*, a logic 1 may be detected based on difference in charge, Q, between charge state 305-*a* and charge state 370 (e.g., a relatively small amount of charge transfer), and a logic 0 may be detected based on a difference in charge, Q, between charge state 310-*a* and charge state 370 (e.g., a relatively large amount of charge transfer).

In some examples, such a detection may be supported by a charge-transfer sensing amplifier, a cascode (e.g., a transistor operated in a cascode configuration which, in accordance with examples as disclosed herein, may also support a decoding functionality), or other circuitry of a signal development component 260 between a digit line 130-*a* and a signal line 265, and a voltage of the signal line 265 may be based at least in part on the amount of charge transfer of a capacitor 220 after initiating a read operation. In such examples, a voltage of the signal line 265 may be compared with a reference voltage (e.g., at a sense amplifier 270) to determine the logic state initially stored by the ferroelectric capacitor 220, despite a digit line 130-*a* being held at a fixed voltage level.

In some examples where a digit line 130-*a* is held at a fixed read voltage 335, a capacitor 220 may be positively saturated after a read operation irrespective of whether the capacitor 220 was initially at a charge state 305-*a* (e.g., a logic 1) or initially at a charge state 310-*a* (e.g., a logic 0). Accordingly, after such a read operation, the capacitor 220 may, at least temporarily, be charged according to a logic 1 state irrespective of its initial or intended logic state. Thus, a rewrite operation may be performed at least when the capacitor 220 is intended to store a logic 0 state, and such a rewrite operation may include applying a write voltage 325 to store a logic 0 state as described with reference to hysteresis plot 300-*a*. Such rewrite operations may be configured or otherwise described as a selective rewrite operation, since a rewrite voltage may not need to be applied when the capacitor 220 is intended to store a logic 1 state. In some examples, such an access scheme may be referred to as a "2Pr" scheme, where the difference in charge for distinguishing a logic 0 from a logic 1 may be equal to two times the remnant polarization of a memory cell 105 (e.g., a difference in charge between charge state 305-*a*, a positively saturated charge state, and charge state 310-*a*, a negatively saturated charge state).

Figure 4:
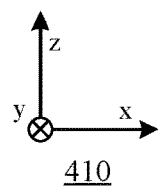
FIG. 4 illustrates an example of a transistor structure that supports signal development circuitry layouts in a memory device in accordance with examples as disclosed herein.
Figure 4:
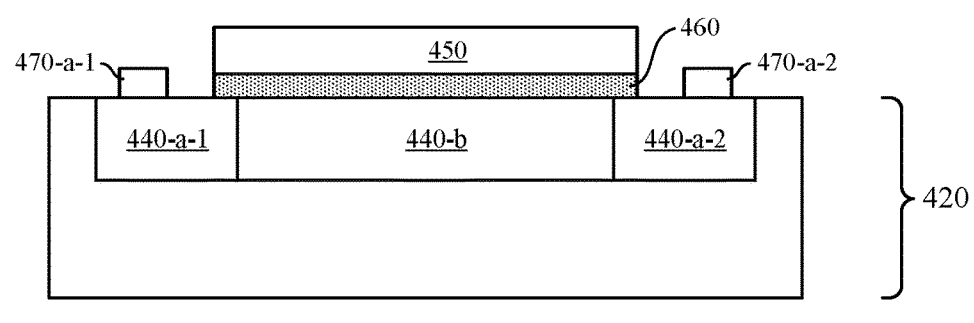

FIG. 4 illustrates an example of a transistor structure 400 that supports signal development circuitry layouts in a memory device in accordance with examples as disclosed herein. The transistor structure 400 illustrates an example of a transistor that is formed at least in part by portions of a substrate 420 (e.g., doped portions 440 of the substrate 420), and may illustrate an arrangement of features for a transistor that is configured in a planar transistor arrangement. The substrate 420 may be a portion of a semiconductor wafer, such as a silicon chip of a memory die (e.g., crystalline silicon, monocrystalline silicon). For illustrative purposes, aspects of the transistor structure 400 may be described with reference to an x-direction, a y-direction, and a z-direction (e.g., a height direction) of a coordinate system 410. In some examples, the z-direction may be illustrative of a direction perpendicular to a surface of the substrate 420 (e.g., a surface in an xy-plane, a surface upon or over which other materials may be deposited), and each of the structures, illustrated by their respective cross section in an xz-plane, may extend for some distance (e.g., length) along the y-direction.

The transistor structure 400 illustrates an example of a transistor channel, electrically coupled between a terminal 470-*a*-1 and a terminal 470-*a*-2, that may include one or more doped portions 440 of the substrate 420. In various examples, one of the terminals 470-*a*-1 or 470-*a*-2 may be referred to as a source terminal, and the other of the terminals 470-*a*-1 or 470-*a*-2 may be referred to as a drain terminal, where such designation may be based on a configuration or relative biasing of a circuit that includes the transistor structure 400. The channel (e.g., channel portion) of a transistor may include or refer to one or more portions of the transistor structure that are operable to open or close a conductive path (e.g., to modulate a conductivity, to form a channel, to open a channel, to close a channel) between a source and drain (e.g., between the terminal 470-*a*-1 and the terminal 470-*a*-2) based at least in part on a voltage of a gate (e.g., a gate terminal, a gate portion 450) of the transistor. In other words, a channel of a transistor may be configured to be activated (e.g., made conductive) or deactivated (e.g., made non-conductive) based at least in part on a voltage of a gate, such as gate portion 450. In some examples of transistor structure 400 (e.g., a planar transistor arrangement), the channel portion formed by one or more doped portions 440 of the substrate 420 may support a conductive path in a generally horizontal direction (e.g., an "in-plane" direction, along the x-direction, within an xy-plane, in a direction within or parallel to a surface of the substrate 420).

The gate portion 450 may be physically separated from the channel portion (e.g., separated from the substrate 420, separated from one or more of the doped portions 440) by a gate insulation portion 460 (e.g., a gate dielectric). Each of the terminals 470 may be in contact with or otherwise coupled with (e.g., electrically, physically) a respective doped portion 440-*a*, and each of the terminals 470 and the gate portion 450 may be formed from an electrically conductive material such as a metal or metal alloy, or a polycrystalline semiconductor (e.g., polysilicon), among other conductor or semiconductor arrangements formed above the substrate 420.

In some examples, the transistor structure 400 may be operable as an n-type (e.g., n-channel) transistor, where applying a relatively positive voltage to the gate portion 450 that is above a threshold voltage (e.g., an applied voltage having a positive magnitude, relative to a source terminal, that is greater than a threshold voltage) activates the channel portion or otherwise enables a conductive path between the terminals 470-*a*-1 and 470-*a*-2 (e.g., along a direction generally aligned with the x-direction within the substrate 420). In some such examples, the doped portions 440-*a* may refer to portions having n-type doping or n-type semiconductor, and the doped portion 440-*b* may refer to a portion having p-type doping or p-type semiconductor (e.g., a channel portion having an NPN configuration along the x-direction or channel direction).

In some examples, the transistor structure 400 may be operable as a p-type (e.g., p-channel) transistor, where applying a relatively negative voltage to the gate portion 450 that is above a threshold voltage (e.g., an applied voltage having a negative magnitude, relative to a source terminal, that is greater than a threshold voltage) activates the channel portion or otherwise enables a conductive path between the terminals 470-*a*-1 and 470-*a*-2. In some such examples, the doped portions 440-*a* may refer to portions having p-type doping or p-type semiconductor, and doped portion 440-*b* may refer to a portion having n-type doping or n-type semiconductor (e.g., a channel portion having a PNP configuration along the x-direction or channel direction).

In some examples, circuitry operable to support access operations on memory cells 105 (e.g., at least a portion of a row component 125, a column component 135, a plate component 145, a sense component 150, or a memory controller 170, or various combinations thereof) may be formed to include respective sets of transistors each having the arrangement of the transistor structure 400, where each of the transistors may have a channel portion formed by respective doped portions 440 of a substrate 420. In some examples, such transistors may leverage a crystalline semiconductor material of the substrate 420 for various performance characteristics or manufacturing characteristics of such a material or such an arrangement. Some examples of such an arrangement may be implemented in a complementary metal-oxide-semiconductor (CMOS) configuration, which may refer to various examples of a complementary and symmetrical pair of a p-type transistor and an n-type transistor (e.g., for logic functions). However, such structures or arrangements of substrate-based transistors may be limited by an available area of the substrate 420 (e.g., under a memory array 110 or stack of levels or decks of memory arrays 110).

In accordance with examples as disclosed herein, various aspects of a signal development component 260, among other circuitry (e.g., addressing circuitry, shunting circuitry), may be located separate from or away from (e.g., above) a substrate 420, including having various components or circuitry at different levels of one or more memory arrays 110. For example, some circuitry, such as transistors that support aspects of signal development associated with a signal development component 260, may be formed in multiple levels above a substrate 420, where such transistors may include or be referred to as thin film transistors, or vertical transistors, among other configurations or terminology.

Figure 5:
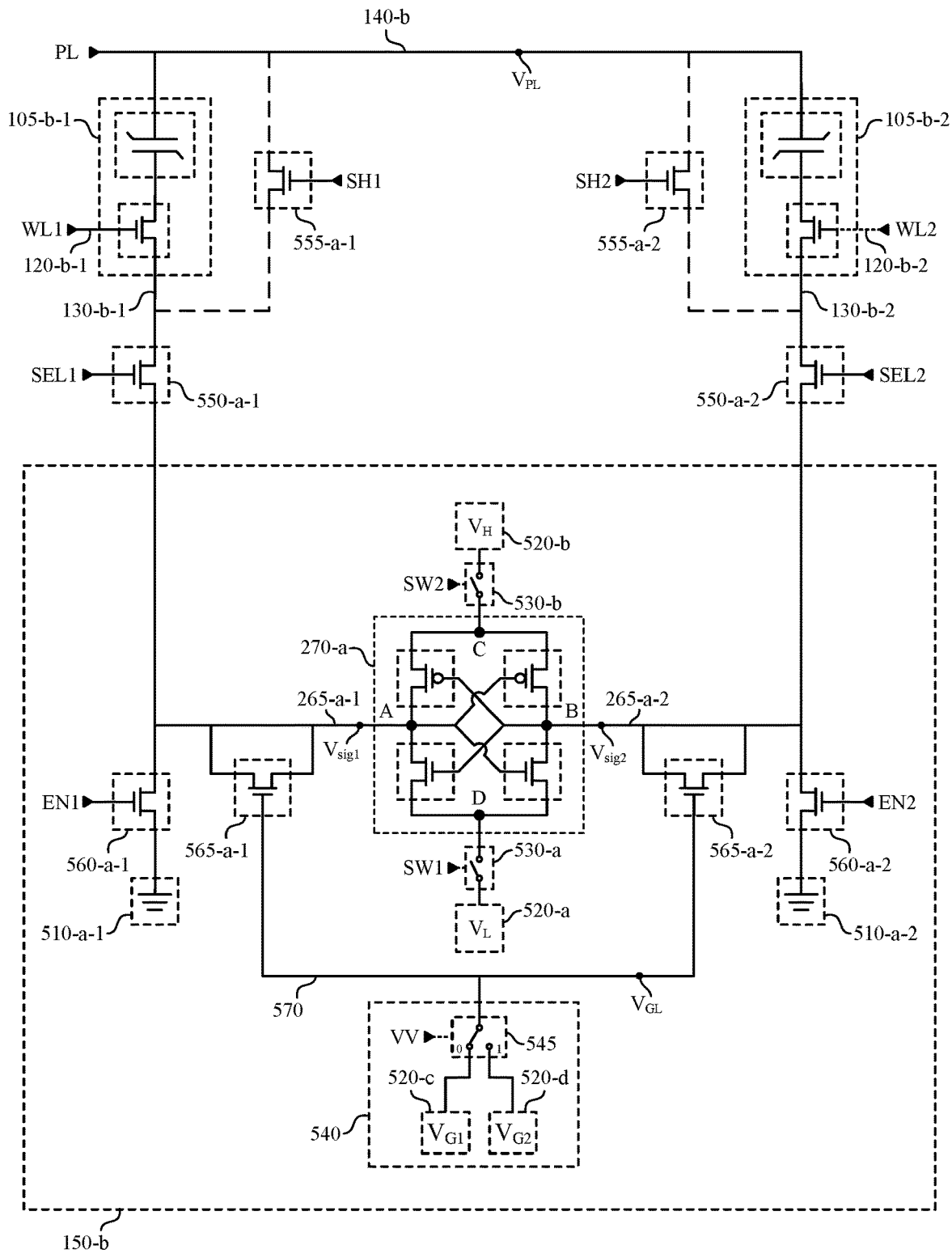
FIG. 5 illustrates an example of a circuit that supports signal development circuitry layouts in a memory device in accordance with examples as disclosed herein.

FIG. 5 illustrates an example of a circuit 500 that supports signal development circuitry layouts in a memory device in accordance with examples as disclosed herein. The circuit 500 includes memory cells 105-*b* (e.g., a pair of memory cells 105-*b*) that are configured to be coupled with a sense component 150-*b*, which may be examples of aspects of memory cells 105 and sense components 150 as described with reference to FIGS. 1 through 4. The circuit 500 illustrates an example of a complementary memory cell arrangement (e.g., a complementary referencing configuration).

The sense component 150-*b* includes a sense amplifier 270-*a* that is coupled with circuitry (e.g., of a signal development component 260) for sensing a logic state based on accessing the memory cells 105-*b* (e.g., based on latching a signal difference between an accessing of the memory cell 105-*b*-1 and an accessing of the memory cell 105-*b*-2). Signals may be communicated between the memory cells 105-*b* and the sense amplifier 270-*a* over respective digit lines 130-*b* and signal lines 265-*a*, which may, in combination with any other constituent signal paths, be referred to as a respective access line between a memory cell 105-*b* and the sense amplifier 270-*a*. Operation of circuit 500 may also be supported by various configurations of word lines 120 and plate lines 140. For example, as illustrated, at least the memory cells 105-*b*-1 and 105-*b*-2 may be coupled with a common plate line 140-*b*, and the memory cells 105-*b*-1 and 105-*b*-2 may be coupled with word lines 120-*b*-1 and 120-*b*-2, respectively, which may be commonly driven or independently driven. Signals of the access lines may be illustrated by a voltage $V_{sig1}$ on the signal line 265-*a*-1, a voltage $V_{sig2}$ on the signal line 265-*a*-2, and a voltage $V_{PL}$ on the plate line 140-*b*, as shown.

The circuit 500 may include ground nodes 510, which may represent nodes that are coupled with a common grounding point (e.g., a chassis ground, a neutral point, a virtual ground, a ground voltage source). The ground nodes 510 may be associated with a common reference voltage having a voltage $V_0$, from which other voltages are defined or otherwise related. The circuit 500 also includes voltage sources 520, which may represent nodes that are coupled with various voltage supplies of a memory device 100 that includes the example circuit 500. A respective voltage source 520 may be coupled with a voltage supply that is regulated at a memory device 100 that includes the circuit 500, or is not regulated at the memory device 100 (e.g., is regulated or otherwise supplied by a host device that is coupled with the memory device 100). In some examples, two or more of the voltage sources 520 may be coupled with the same voltage supply (e.g., a common voltage source), and may, in some implementations, be associated with a same voltage level.

The circuit 500 may include switching components 530, which may be coupled with (e.g., between, electrically) components to provide a selective coupling or decoupling functionality. In some examples, a switching component 530 may be a transistor (e.g., an n-type transistor, a p-type transistor), and a logical signal (e.g., SW #) may be applied to a gate of the transistor to enable or disable a conductive path (e.g., a channel) through the transistor. As described herein, enabling a logical signal (e.g., as a logic 1) at a switching component 530 may enable a conductive path through the switching component 530 (e.g., closing a circuit path), and disabling the logical signal (e.g., as a logic 0) at the switching component 530 may disable a conductive path through the switching component 530 (e.g., opening a circuit path). Logical signals SW #, among other logical signals, may be provided by a memory controller (not shown), such as a memory controller 170 described with reference to FIG. 1, or any other component of a memory device 100 that supports access operation timing.

The circuit 500 may include a variable voltage source 540, which may include various configurations of voltage sources 520 and a selection component 545 controlled via a logical signal, VV. Logical signal VV may be provided by a memory controller (not shown), such as a memory controller 170 described with reference to FIG. 1, or any other component of a memory device 100 that supports access operation timing. Although the variable voltage source 540 is illustrated as including two voltage sources 520 and a selection component 545, a variable voltage source 540 supporting the operations described herein may include other configurations, such as including more than two voltage sources 520, or including a voltage buffer that otherwise provides a variable voltage. In some examples, a variable voltage source 540 may include two or more switching components 530 in place of a selection component 545, which may support a floating voltage condition.

The circuit 500 may include transistors 550, 555, 560, and 565, which may support various aspects of accessing the memory cells 105-b. In accordance with examples as disclosed herein, the set of transistors 550, 555, 560, and 565 may be implemented at two or more levels of a memory die, which may involve various implementations of thin film transistor (TFT) techniques (e.g., where one or more of transistors 550, 555, 560, or 565 are implemented as thin film transistors, such as vertical transistors). In some examples, any combination of transistors 550, 555, 560, and 565 may be positioned in two or more levels of a memory die above a substrate.

The transistors 550 may support a decoding functionality (e.g., a level selection, a deck selection) of the circuit 500. For example, each digit line 130-b of a multi-level memory array that includes the circuit 500 (e.g., having digit lines 130-b on multiple levels) may be associated with a respective transistor 550-a, and the respective transistor 550-a may support coupling the digit line 130-b of a given level with the sense amplifier 270-a (e.g., via a signal line 265-a). The transistor 550-a-1 may support coupling the digit line 130-b-1 with the signal line 265-a-1 (e.g., based on an input signal SEL1, which may be associated with a deck selection signal), and so on. Digit lines 130-b of one or more levels that are not associated with an access operation may be isolated from a signal line 265-b by not activating the respective transistor 550-a.

The transistors 555 may support a shunting functionality of the circuit 500. For example, each digit line 130-b may be associated with a respective transistor 555-a, and the respective transistor 555-a may support coupling the digit line 130-b with the plate line 140-b. Such a coupling may equalize a voltage across a set of memory cells 105-b (e.g., a column of memory cells) between the digit line 130-b and the plate line 140-b, which may reduce an accumulation of leakage charge (e.g., at capacitors 220) that might otherwise corrupt logic states stored by the set of memory cells 105-b. The transistor 555-a-1 may support shunting the digit line 130-b-1 with the plate line 140-b (e.g., based on an input signal SH1), and so on. A shunting path of a digit line 130-b that is associated with an access operation may be opened by not activating the respective transistor 555-a. In some examples, the circuit 500 may be implemented without such a shunting functionality, and accordingly may omit transistors 555.

The transistors 560 may support a grounding functionality of the circuit 500. For example, each signal line 265-a may be associated with a respective transistor 560-a, and the respective transistor 560-a may support coupling the signal line 265-a with a ground node 510-a. Such a coupling may reset (e.g., zero) a voltage of the signal line 265-a, which may be performed before, after, or as part of an access operation (e.g., before coupling memory cells 105-b with the signal lines 265-a, after a latching by the sense amplifier 270-a). The transistor 560-a-1 may support coupling the signal line 265-a-1 with the ground node 510-a-1 (e.g., based on an input signal EN1), and so on. A grounding path of a signal line 265-a that is associated with an access operation may be opened by not activating the respective transistor 560-a.

The transistors 565 may support a voltage displacement functionality (e.g., a voltage offset functionality, a voltage shifting functionality) of the circuit. For example, each signal line 265-a may be associated with a respective transistor 565-a, and the respective transistor 565-a may support a signal being generated on the signal line in accordance with a first voltage (e.g., while a gate of the respective transistor 565-a is biased with a first voltage, such as $V_{G1}$ via voltage source 520-d), and displaced (e.g., shifted, offset) to a second voltage based on changing a voltage applied to the gate of the respective transistor 565-a (e.g., based on transitioning the gate of the respective transistor 565-a to being biased with a second voltage, such as $V_{G2}$ via voltage source 520-c, which may be initiated based on input signal VV).

In some examples, such operations may leverage a capacitance of the respective transistor 565-a (e.g., between a gate and channel of the respective transistor 565-a, between a gate of the respective transistor 565-a and the signal line 265-a). In some examples, the transistors 565 may be referred to as capacitors, where a respective capacitance is provided between structures of the circuit 500 that are commonly formed with other transistors (e.g., one or more of transistors 550, 555, or 560) of the circuit 500. For example, a transistor 565 may alternatively be referred to as a gate-oxide-silicon capacitor (e.g., a capacitor implemented in a metal oxide semiconductor arrangement)

In some examples, both ends of a channel associated with a transistor 565-*a* may be directly connected with the corresponding signal line 265-*a* (e.g., via a metal connection). In some other examples, one or both ends of a channel associated with a transistor 565-*a* may be connected with the corresponding signal line 265-*a* via a selectable connection such as another transistor (not shown). The transistor 565-*a*-1 may support displacing a voltage of the signal line 265-*a*-1, and the transistor 565-*a*-2 may support displacing a voltage of the signal line 265-*a*-2, and so on. As illustrated, the gates of at least corresponding pairs of transistors 565-*a* (e.g., where the transistors 565-*a*-1 and 565-*a*-2 may be an example of such a pair) may be commonly biased (e.g., using a shared variable voltage source 540, via a gate line 570 associated with a voltage $V_{GL}$).

The sense amplifier 270-*a* illustrates an example of circuitry configured to detect a logic state based at least in part on comparing a first sense signal (e.g., of the signal line 265-*a*-1) to a second sense signal (e.g., of the signal line 265-*a*-2). The sense amplifier 270-*a* includes a first node, node A, configured to be coupled with the first signal line 265-*a*-1, which may be an example of a first node 271, and a second node, node B, configured to be coupled with the second signal line 265-*a*-2, which may be an example of a second node 272. The sense amplifier 270-*a* also includes a third node, node C, which may be referred to as a high sense amplifier supply node, and a fourth node, node D, which may be referred to as a low sense amplifier supply node. The example of sense amplifier 270-*a* illustrates a configuration with a pair of cross-coupled p-type transistors and a pair of cross-coupled n-type transistors. However, other configurations of a sense amplifier 270 may be used in accordance with the described techniques, including a pair of opposed differential amplifiers coupled between the first node and the second node. In some examples, transistors of the sense amplifier 270-*a*, among other transistors supporting operation of the circuit 500, may be implemented using doped portions of a substrate, such as a substrate 420.

Figure 6:
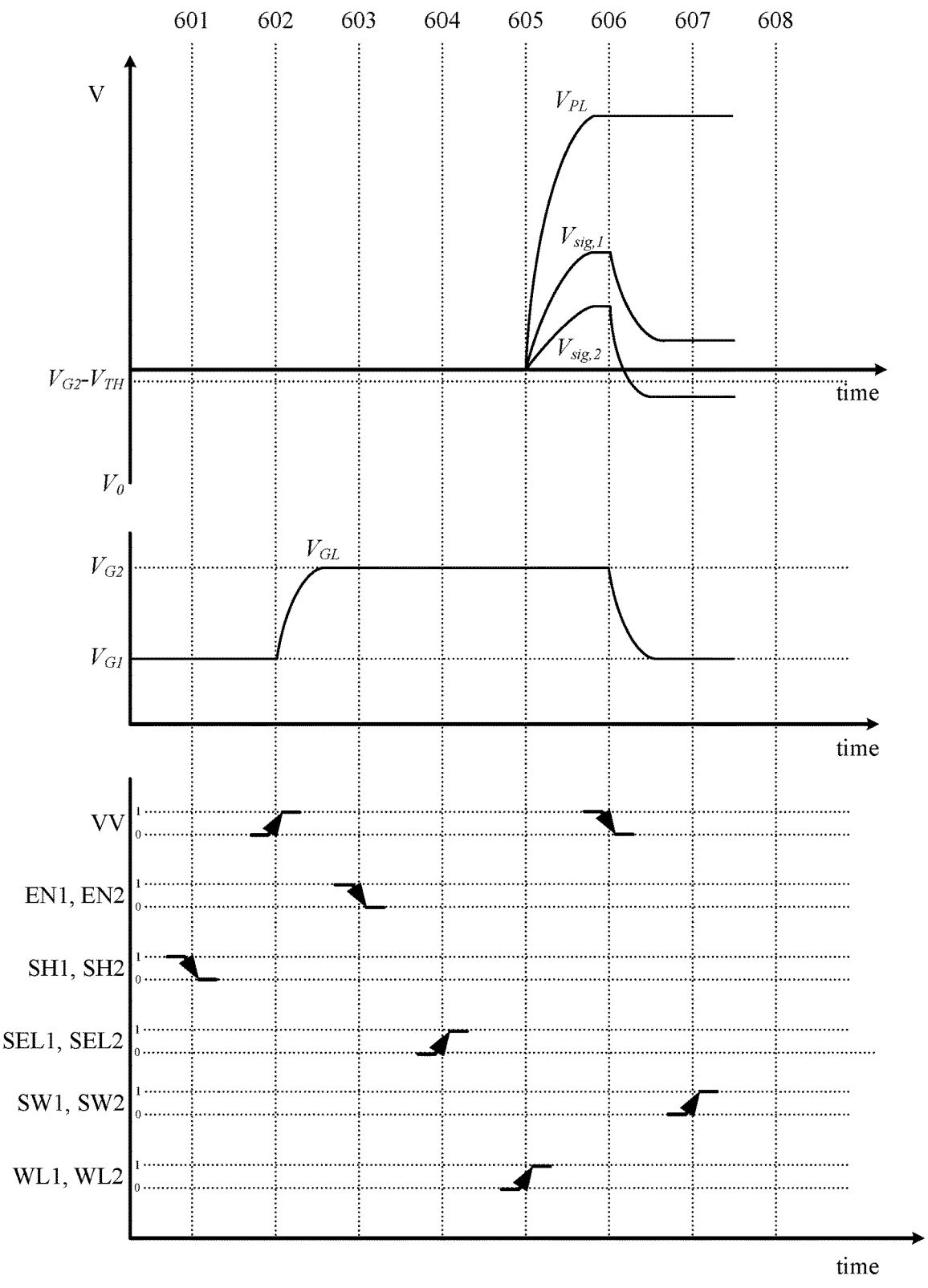
FIG. 6 shows a timing diagram illustrating operations of an example access procedure that supports signal development circuitry layouts in a memory device in accordance with examples as disclosed herein.

FIG. 6 shows a timing diagram 600 illustrating operations of an example access operation that supports signal development circuitry layouts in a memory device in accordance with examples as disclosed herein. The example access operation is described with reference to components of the circuit 500 described with reference to FIG. 5.

Before the access operation of the timing diagram 600 (e.g., before 601), the components of circuit 500 may be in various conditions, which may include initial conditions. For example, each of switching components 530-*a* and 530-*b* may be open or deactivated (e.g., via deactivated logical signals SW1 and SW2, to deactivate the sense amplifier 270-*a*). In some examples, transistors 550-*a* may be deactivated (e.g., via deactivated logical signals SEL1 and SEL2, to isolate digit lines 130-*b* from signal lines 265-*a*, to deselect a deck of memory cells 105-*b*), transistors 555-*a* may be activated (e.g., via activated logical signals SH1 and SH2, to support a shunting between digit lines 130-*b* and the plate line 140-*b*), transistors 560-*a* may be activated (e.g., via activated logical signals EN1 and EN2, to support a grounding of the signal lines 265-*a*), and gates of transistors 565-*a* may biased with an initial voltage (e.g., $V_{G1}$, which may be a ground voltage, via a deactivated logical signal VV). In some examples, the digit lines 130-*b* and the plate line 140-*b* may be grounded (e.g., at a voltage of 0V).

Further, before the access operation of the timing diagram 600, the memory cells 105-*b*-1 and 105-*b*-2 may have been written in accordance with a logic state (e.g., a shared logic state). For example, one of the memory cells 105-*b* may have been written with a negative polarization (e.g., a charge state 305-*a*, by applying a voltage 315) and the other of the memory cells 105-*b* may have been written with a positive polarization (e.g., a charge state 310-*a*, by applying a voltage 325), where the relative difference in polarization between the memory cells 105-*b*-1 and 105-*b*-2 may be associated with the written logic state. The operations of the timing diagram 600 may illustrate aspects of a read operation that determines the written logic state based on differential signaling from accessing the memory cells 105-*b*-1 and 105-*b*-2.

At 601, the access operation may include disabling a shunting of the digit lines 130-*b*. For example, logical signals SH1 and SH2 may be deactivated, which may isolate the digit lines 130-*b*-1 and 130-*b*-2 from the plate line 140-*b* (e.g., based on deactivating the transistors 555-*a*-1 and 555-*a*-2, respectively).

At 602, the access operation may include shifting (e.g., boosting) a voltage applied to the gates of the transistors 565-*a*. For example, logical signal VV may be activated, which may transition the variable voltage source 540 from biasing the gate line 570 with the voltage $V_{G1}$ to biasing the gate line 570 with the voltage $V_{G2}$. In some examples, (e.g., due to a grounding via transistors 560-*a*), the voltage of the signal lines 265-*a* may be unaffected (e.g., may remain at 0V through the operations of 602).

At 603, the access operation may include disabling a grounding of the signal lines 265-*a*. For example, logical signals EN1 and EN2 may be deactivated, which may isolate the signal lines 265-*a*-1 and 265-*a*-2 from the ground nodes 510-*a*-1 and 510-*a*-2, respectively (e.g., based on deactivating the transistors 560-*a*-1 and 560-*a*-2, respectively). In some examples, after the operations of 603, the signal lines 265-*a*-1 and 265-*a*-2 may be in a floating condition, but may remain at or near 0V.

At 604, the access operation may include selecting the digit lines 130-*b*-1 and 130-*b*-2, which may involve a deck selection operation. For example, logical signals SEL1 and SEL2 may be activated, which may couple the digit line 130-*b*-1 with the signal line 265-*a*-1 and couple the digit line 130-*b*-2 with the signal line 265-*a*-2 (e.g., based on activating the transistors 550-*a*-1 and 550-*a*-2, respectively).

At 605, the access operation may include selecting the memory cells 105-*b*-1 and 105-*b*-2, which may involve a cell selection operation. For example, logical signals WL1 and WL2 may be activated, which may couple a storage element (e.g., a capacitor 220) of the memory cell 105-*b*-1 with the digit line 130-*b*-1 and couple a storage element of the memory cell 105-*b*-2 with the digit line 130-*b*-2 (e.g., based on activating cell selection components, such as cell selection components 230 of the memory cells 105-*b*-1 and 105-*b*-2, respectively). In some examples, the operations of 605 may also include transitioning the plate line 140-*b* from a low voltage (e.g., a ground voltage) to a voltage that supports reading the memory cells 105-*b*-1 and 105-*b*-2. However, in some other examples, such a biasing of the plate line 140-*b* may be performed before or after the operations of 605 (e.g., before the operations of 606).

In some examples, the biasing between the plate line 140-*b* and the signal lines 265-*a* (e.g., a difference between $V_{PL}$ and a voltage of the ground nodes 510-$a$) across the selected memory cells 105-$b$ may correspond to a read voltage 335 described with reference to FIG. 3B. In some examples, such a biasing by the plate line 140-$b$ may correspond to a "plate high" read bias on the memory cells 105-$b$. In response to the biasing of 605, and the selection of the memory cells 105-$b$-1 and 105-$b$-2, charge may flow between the storage components of the memory cells 105-$b$-1 and 105-$b$-2 and the signal lines 265-$a$-1 and 265-$a$-2, respectively, thereby generating different voltages on the signal lines 265-$a$-1 and 265-$a$-2 (e.g., due to the different polarizations of the memory cells 105-$b$-1 and 105-$b$-2).

In the example of timing diagram 600, the memory cell 105-$b$-1 may be associated storing a charge state 305-$a$, such that $V_{sig,1}$ may rise to a relatively higher level (e.g., associated with a charge state 305-$c$), and the memory cell 105-$b$-2 may be associated storing a charge state 310-$a$, such that $V_{sig,2}$ may rise to a relatively lower level (e.g., associated with a charge state 310-$c$). The difference between $V_{sig,1}$ and $V_{sig,2}$ may be evaluated to determine the logic state collectively written to the memory cells 105-$b$-1 and 105-$b$-2. However, in some examples (e.g., due to a transistor configuration of the sense amplifier 270-$a$), it may be beneficial to perform an evaluation where one of the signal lines 265-$a$ is above a reference voltage (e.g., a ground voltage) and the other signal line 265-$a$ is below the reference voltage.

At 606, the access operation may include shifting (e.g., decreasing, displacing, offsetting) a voltage applied to the gates of the transistors 565-$a$. For example, logical signal VV may be deactivated, which may transition the variable voltage source 540 from biasing the gate line 570 with the voltage $V_{G2}$ to biasing the gate line 570 with the voltage $V_{G1}$. In response, the voltage of the signal lines 265-$a$-1 and 265-$a$-2 may each shift (e.g., drop), due to shift in voltage applied to the gates of the transistors 565-$a$ and the capacitance between the gates and channels of the transistors 565. Thus, the capacitance between structures of the transistors 565 may be leveraged (e.g., as capacitors) to pull down the voltage of the signal lines 265-$a$-1 and 265-$a$-2 such that, after the operations of 606, a voltage of one of the signal lines 265-$a$ (e.g., signal line 265-$a$-1) may be above the reference voltage (e.g., above 0V) and a voltage of the other of the signal lines 265-$a$ (e.g., signal line 265-$a$-2) may be below the reference voltage (e.g., above 0V).

At 607, the access operation may include determining the logic state stored by the memory cells 105-$b$-1 and 105-$b$-2, which may include a latching of a difference between $V_{sig,1}$ and $V_{sig,2}$. For example, logical signals SW1 and SW2 may be activated, which may couple node C of the sense amplifier 270-$a$ with the voltage source 520-$b$ and couple node D of the sense amplifier 270-$a$ with the voltage source 520-$a$ (e.g., based on activating switching components 530-$b$ and 530-$a$, respectively). In some examples, such a latching may be performed after isolating node C from the signal line 265-$a$-1 and isolating node D from the signal line 265-$a$-2 (e.g., via isolation transistors, not shown)

At 608, the access operation may include or be followed by various subsequent operations. In some examples (in cases where the operations of 605 through 607 involve disturbing a polarization state of either of the memory cells 105-$b$), after determining the logic state, the logic state may be written back to the memory cells 105-$b$-1 and 105-$b$-2, which may involve applying a write bias to one of the memory cells 105-$b$ (e.g., the memory cell 105-$b$-2, which may have been at least partially depolarized during the operations of 605, but not the memory cell 105-$b$-1, which may not have been depolarized during the operations of 605) or applying a write bias to both of the memory cells 105-$b$. In some examples, at 608, the access operation may include or be followed by various operations to return the circuit 500 to one or more initial conditions (e.g., deactivating logical signals SW1 and SW2, deactivating transistors 550-$a$, activating transistors 555-$a$, activating transistors 560-$a$, biasing gates of transistors 565-$a$ with an initial voltage.

The order of operations shown in timing diagram 600 is for illustration purposes, and various other orders and combinations of steps (e.g., in concurrent operation) may be performed to support the described techniques. Further, the timing of the operations of timing diagram 600 is also for illustration purposes, and is not meant to indicate a particular relative duration between one operation and another. Various operations in accordance with examples as disclosed herein may occur over a duration that is relatively shorter or relatively longer than illustrated in various examples in accordance with the present disclosure. Further, various operations illustrated in the timing diagram 600 may occur over overlapping or concurrent durations in support of the techniques described herein.

The transitions of the logical signals of the timing diagram 600 are illustrative of transitions from one state to another, and generally reflect transitions between an enabled or activated state (e.g., state "0") and a disabled or deactivated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a curve over time from one logical state to another. Thus, the transitions shown in timing diagram 600 are not necessarily indicative of an instantaneous transition. Further, the initial state of a logical signal associated with a transition at a numbered operation may have been arrived at during various times preceding the numbered operation while still supporting the described transitions and associated operations.

Figure 7:
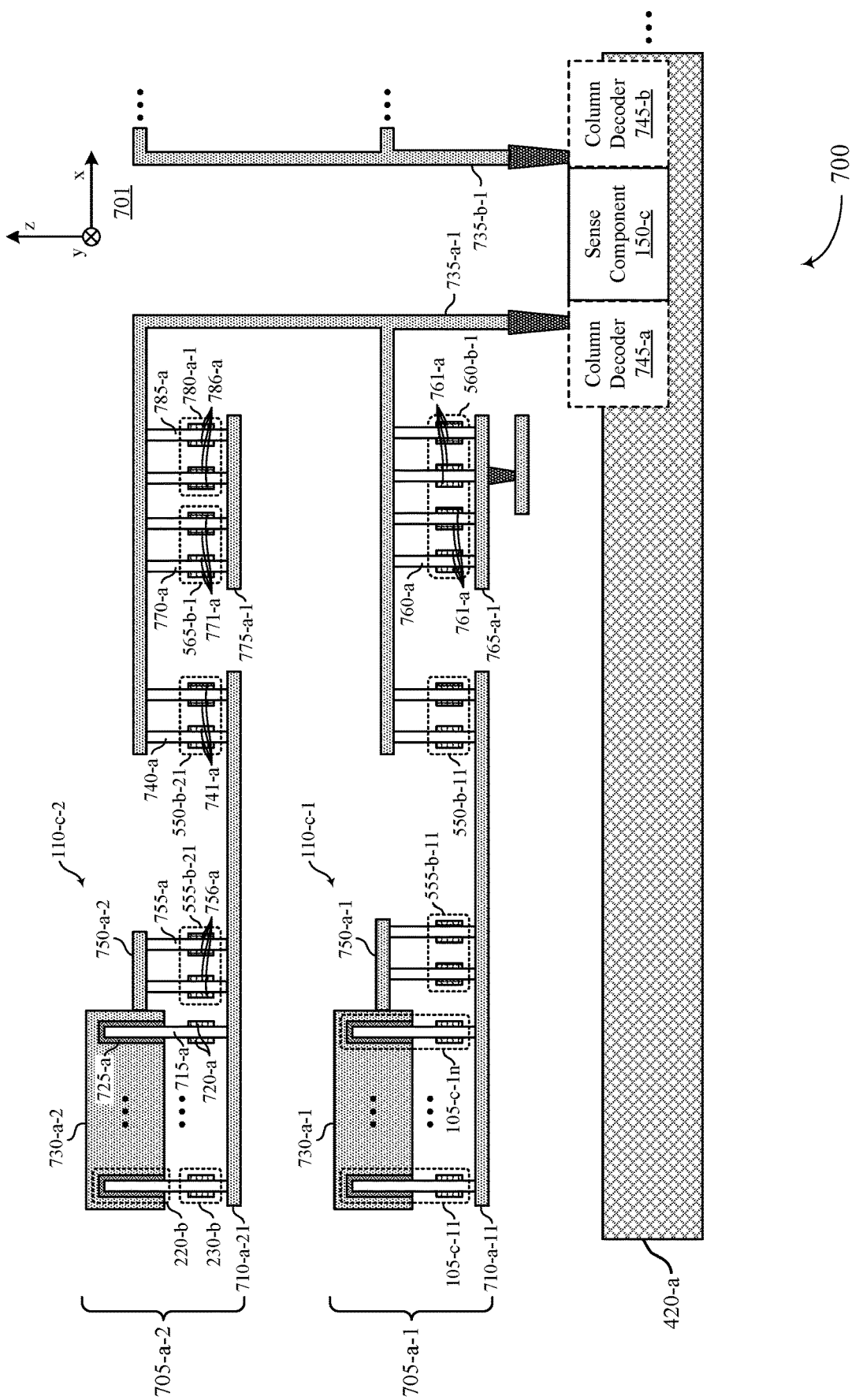
FIG. 7 illustrates an example of a memory structure that supports signal development circuitry layouts in a memory device in accordance with examples as disclosed herein.

FIG. 7 illustrates an example of a memory structure 700 that supports signal development circuitry layouts in a memory device in accordance with examples as disclosed herein. The memory structure 700 may be illustrative of portions of a memory device 100 or memory die that may be formed with or over a substrate 420-$a$, which may be an example of a substrate 420 described with reference to FIG. 4. The memory structure 700 may illustrate examples for implementing aspects of the circuit 500 described with reference to FIG. 5. For example, the memory structure 700 may illustrate an example of structures for implementing circuitry associated with a first signal line 265 (e.g., signal line 265-$a$-1 of the circuit 500), which may be associated with the signal line conductor 735-$a$-1. In some examples, similar structures (e.g., structures generally symmetric across a yz-plane) may be implemented for circuitry associated with a second signal line 265 (e.g., signal line 265-$a$-2 of the circuit 500), which may be associated with the signal line conductor 735-$b$-1 and a column decoder 745-$b$, but such similar structures are omitted for illustrative clarity.

For illustrative purposes, aspects of the memory structure 700 may be described with reference to an x-direction, a y-direction, and a z-direction of a coordinate system 701. The z-direction may be illustrative of a direction relative to (e.g., perpendicular to) a surface of the substrate 420-$a$ (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105).

The memory structure 700 illustrates an example of memory arrays 110 associated with different levels 705 (e.g., different decks, a stack of decks, a stack of levels). For example, the memory array 110-c-1 may be associated with a level 705-a-1 at a first position (e.g., height) relative to the substrate 420-a, and the memory array 110-c-2 may be associated with a level 705-a-2 at a second (e.g., different) position relative to the substrate 420-a (e.g., above the level 705-a-1, relative to the substrate 420-a). Although the memory structure 700 illustrates an example with two levels 705-a, techniques described herein may be applied in a memory structure having any quantity of one or more levels 705.

At least some, if not each of the memory arrays 110-c may include a respective set of memory cells 105-c arranged according to rows (e.g., aligned along the y-direction, addressed according to a position along the x-direction) and columns (e.g., aligned along the x-direction, addressed according to a position along the y-direction). For example, a column of the memory array 110-c-1 may include n memory cells 105-c-11 through 105-c-1n, and may be associated with (e.g., formed upon, formed in contact with, coupled with) a digit line conductor 710-a-11 (e.g., an example of a digit line 130). In some examples, a column of the memory array 110-c-2 may include a same quantity of memory cells 105-c, which may or may not be physically aligned (e.g., along the z-direction) or overlapping (e.g., when viewed in an xy-plane) with the memory cells 105-c of the memory array 110-c-1. A quantity of columns, m, may be formed by repeating the illustrated memory cells 105-c and digit line conductors 710-c, among other features, along the y-direction.

At least some, if not each of the memory cells 105-c in the memory structure 700 may include a respective capacitor 220-b and a respective cell selection component 230-b (e.g., a transistor). In the example of memory structure 700, each of the cell selection components 230-b may be formed as a vertical transistor, which may include a channel portion (e.g., a vertical channel) formed at least in part by a respective pillar 715-a, or portion thereof (e.g., along the z-direction), and a gate portion formed at least in part by a respective word line conductor 720-a (e.g., an example of a word line 120). In some examples, the gate portion of a cell selection component 230-b may be a portion or a region of a word line 120 or word line conductor 720-a that is operable to activate the channel portion (e.g., to modulate a conductivity of the channel portion) of the cell selection component 230-b. The word line conductors 720-a may extend from one memory cell 105-c to another memory cell 105-c along a direction, such as the y-direction (e.g., a row direction, along a row of memory cells 105-c), and may be coupled with a row component 125 (not shown) for selecting (e.g., activating) a row of memory cells 105-c (e.g., by biasing the word line conductors 720-a).

In some examples, word line conductors 720-a of one memory array 110-c (e.g., memory array 110-c-1) may be coupled with word line conductors 720-a of another memory array 110-c (e.g., memory array 110-c-2, a memory array 110-c operable to couple with the signal line conductor 735-b), such that rows of memory cells 105-c may be commonly activated across multiple memory arrays 110-c or multiple levels 705-a (e.g., by a common node or output of a shared row component 125, not shown). In some examples, interconnections between word line conductors 720-a of different levels 705-a may be formed at least in part along the z-direction by one or more vias, sockets, or TSVs, which may be located at or near a boundary of the memory arrays 110-c (e.g., along the y-direction), among other locations relative to the memory arrays 110-c.

Each capacitor 220-b for a memory cell 105-c may include a respective dielectric portion 725-a formed between a pillar 715-a, or some portion otherwise aligned with a pillar (e.g., a portion aligned along the z-direction, an inner portion of the capacitor 220-b), associated with the memory cell 105-c and a plate conductor 730-a (e.g., an example of a plate line 140, a plate node, or a common plate, an outer portion of the capacitor 220-b). For example, each capacitor 220-b may include a respective inner portion aligned along the z-direction with or otherwise coincident with a pillar 715-a, and a respective outer portion (e.g., at least partially concentric around the inner portion) that is separated from the inner portion by a respective dielectric portion 725-a. In some examples, the outer portions of two or more capacitors 220-b may be a contiguous material, such as a contiguous metal or other conductor of a plate line or common plate node (e.g., of a plate conductor 730-a). In some examples, a portion of a pillar 715-a of a capacitor 220-b may be a same material or combination of materials as a portion of the pillar 715-a of a corresponding cell selection component 230-b (e.g., a doped semiconductor material, a polycrystalline semiconductor). In some examples, a portion of a pillar 715-a of capacitor 220-b may be or include a different material or combination of materials as a portion of the pillar 715-a of a corresponding cell selection component 230-b (e.g., a metal or conductor portion, a metal layer deposited on or over a surface of the pillar 715-a). In some examples, the dielectric portions 725-a may be formed with a ferroelectric material operable to maintain a non-zero electric charge or polarization (e.g., corresponding to a stored logic state) in the absence of an electric field.

In the example of memory structure 700, the memory array 110-c-1 may be associated with (e.g., coupled with, include, be accessed using) a plate conductor 730-a-1 and the memory array 110-c-2 may be associated with a plate conductor 730-a-2. Each of the plate conductors 730-a may be coupled with a plate component 145 (not shown) for biasing the plate conductors 730-a. In the example of memory structure 700, each plate conductor 730-a may be associated with at least a column of memory cells 105-c. In some examples, each of the plate conductors 730-a may also extend along the y-direction along a row of memory cells 105-c, in which case each of the plate conductors 730-a may be associated with all of the memory cells 105-c of a respective memory array 110-c. In some examples, a plate conductor 730-a may be a metal or other conductor formed over or between the dielectric portions 725-a of the memory cells 105-c of the respective memory array 110-c.

In the example of memory structure 700, each column of memory cells 105-c of each memory array 110-c may be associated with a respective transistor 550-b (e.g., a deck selection transistor), which may also be formed as a vertical transistor. Each transistor 550-b may be operable to couple a respective digit line conductor 710-a with a respective signal line conductor 735-a (e.g., an example of a signal line 265). In the example of memory structure 700, each signal line conductor 735-a may be a combination of horizontal metal layers formed in contact with (e.g., above, opposite the digit line conductors 710-a) pillars 740-a and a vertical portion coupled with a column decoder 745-a that may be formed by one or more vias, sockets, or TSVs. In the example of memory structure 700, to support m columns per memory array 110-c, m signal line conductors 735-a may be formed along the y-direction, and each signal line conductor 735-a may be coupled with a transistor 550-b of each memory array 110-c or each level 705-a (e.g., signal line conductor 735-a-1 being coupled with transistors 550-b-11 and 550-b-21).

At least some, if not each transistor 550-b may include a channel portion (e.g., a vertical channel) formed at least in part by one or more respective pillars 740-a and a gate portion formed at least in part by one or more respective conductors 741-a (e.g., an example of a deck selection line, one of which may convey a logical signal SEL1). In some examples, the gate portion of a transistor 550-b may be a portion or a region of a deck selection line that is operable to activate the channel portion (e.g., to modulate a conductivity of the channel portion) of the transistor 550-b. The conductors 741-a may extend from one column of memory cells 105-c to another, or from one transistor 550-b to another, along a direction, such as the y-direction (e.g., along a row direction, parallel with rows of memory cells 105-c), and may be coupled with a deck decoder (not shown) for selecting or activating a memory array 110-c (e.g., by biasing the conductors 741-a, by activating a row of transistors 550-b).

The set of m signal line conductors 735-a may be coupled with a column decoder 745-a, which may, in turn, be coupled with a sense component 150-c. Accordingly, a combination of a deck decoder (not shown) and the column decoder 745-a, may be used to multiplex, address, or otherwise selectively couple the digit line conductors 710-a of the memory arrays 110-c-1 and 110-c-2 with the sense component 150-c, or sense amplifiers 270 thereof, to support various access operations. In some examples, column decoders 745 may be omitted, such that signal line conductors 735-a may be coupled directly to the sense component 150-c In the example of memory structure 700, each column of memory cells 105-c of each memory array 110-c may also be associated with a respective transistor 555-b (e.g., a shunting transistor), which also may be formed as a vertical transistor. Each transistor 555-b may be operable to couple a respective digit line conductor 710-a with a conductor portion 750-a (e.g., a conductor portion 750-a respective to the digit line conductor 710-a, a conductor portion 750-a common to the digit line conductors 710-a of a memory array 110-c, a plate connection), which may connect or shunt the respective digit line conductor 710-a with a plate conductor 730-a.

At least some, if not each transistor 555-b may include a channel portion (e.g., a vertical channel) formed at least in part by one or more respective pillars 755-a (e.g., between the respective digit line conductor 710-a and the conductor portion 750-a) and a gate portion formed at least in part by one or more respective conductors 756-a (e.g., an example of a deck shunting line, one of which may convey a logical signal SH1). In some examples, the gate portion of a transistor 555-b may be a portion or a region of a deck shunting line that is operable to activate the channel portion (e.g., to modulate a conductivity of the channel portion) of the transistor 555-b. The conductors 756-a may extend from one column of memory cells 105-c to another, or from one transistor 555-b to another, along a direction, such as the y-direction (e.g., along a row direction, parallel with rows of memory cells 105-c), and may be coupled with a deck decoder (not shown) for shunting a memory array 110-c (e.g., by biasing the conductors 756-a, by activating a row of transistors 555-b).

The conductor portions 750-a, or the functionality thereof, may be provided by various types of structures. In the example of memory structure 700, each of the conductor portions 750-a may include a horizontal conductor portion (e.g., metal layer, a portion aligned along at least the x-direction) formed in contact with (e.g., above, opposite the digit line conductors 710-a) one or more pillars 755-a, and in contact with one or more plate conductors 730-a. In various examples, the conductor portions 750-a may be formed using one or more common processes or materials as the formation of signal line conductors 735-a, or the formation of plate conductors 730-a, or both. In some examples, a conductor portion 750-a may include multiple horizontal conductor portions, one or more vertical conductor portions (e.g., sockets, vias), or any combination thereof.

In some examples, the functionality of the conductor portions 750 may be provided by "shorted" or dummy cells or capacitors (not shown). For example, a conductor portion 750 may include a portion aligned and in contact with one or more pillars 755-a, or a material portion or extension of a pillar 755-a, which may have a similar material, similar dimension, or other aspects similar to an inner portion of a capacitor 220-b. Additionally or alternatively, a conductor portion 750 may include a portion having a similar material, similar dimension, or other aspects similar to an outer portion of a capacitor 220. In such cases, the conductor portions 750 may be formed with one or processes that are also used for forming capacitors 220-b, but may omit a dielectric portion 725.

In the example of memory structure 700, each signal line conductor 735-a may be associated with a respective transistor 560-b (e.g., a grounding transistor), which also may be formed as a vertical transistor. Each transistor 560-b may be operable to couple a respective signal line conductor 735-a with a ground conductor 765-a (e.g., a ground conductor 765-a respective to the signal line conductor 735-a, a ground conductor 765-a common to the signal line conductors 735-a, a ground plane associated with a ground node 510), which may support grounding the respective signal line conductor 735-a (e.g., through one or more vias or other intermediate conductors).

At least some, if not each transistor 560-b may include a channel portion (e.g., a vertical channel) formed at least in part by one or more respective pillars 760-a (e.g., between the signal line conductor 735-a and the ground conductor 765-a) and a gate portion formed at least in part by one or more respective conductors 761-a (e.g., an example of a ground activation line, which may convey a logical signal EN1). In some examples, the gate portion of a transistor 560-b may be a portion or a region of a ground activation line that is operable to activate the channel portion (e.g., to modulate a conductivity of the channel portion) of the transistor 560-b. The conductors 761-a may extend from one transistor 560-b to another, along a direction, such as the y-direction (e.g., along a row direction), and may be coupled with a row component 125, a column component 135, a sense component 150, or other component (not shown) for grounding signal line conductors 735-a (e.g., by biasing the conductors 761-a, by activating a row of transistors 560-b).

In the example of memory structure 700, each signal line conductor 735-a also may be associated with a respective transistor 565-b (e.g., a deflection transistor, a deflection capacitor), which also may be formed as a vertical transistor. Each transistor 565-*b* may be operable to shift (e.g., boost, decrease, shift, deflect) a voltage of a respective signal line conductor 735-*a* (e.g., based on a biasing by a variable voltage source 540, not shown, based on operating the transistor 565-*b* as a capacitor). At least some, if not each transistor 565-*b* may include a channel portion (e.g., a vertical channel) formed at least in part by one or more respective pillars 770-*a* (e.g., between the signal line conductor 735-*a* and an intermediate conductor 775-*a*) and a gate portion formed at least in part by one or more respective conductors 771-*a* (e.g., an example of a gate line, which may convey a voltage $V_{GL}$). The conductors 771-*a* may extend from one transistor 565-*b* to another, along a direction, such as the y-direction (e.g., along a row direction), and may be coupled with a variable voltage source 540 (not shown) for shifting a voltage of signal line conductors 735-*a* (e.g., by biasing the conductors 771-*a*).

In the example of memory structure 700, each signal line conductor 735-*a* also may be associated with a respective transistor 780-*b*, which also may be formed as a vertical transistor. Each transistor 780-*b* may be operable to couple a respective signal line conductor 735-*a* with the respective intermediate conductor 775-*a*, which may support the voltage deflection capability of the transistor 565-*b* coupled with the respective intermediate conductor 775-*a*. At least some, if not each transistor 780-*a* may include a channel portion (e.g., a vertical channel) formed at least in part by one or more respective pillars 785-*a* (e.g., between the signal line conductor 735-*a* and the intermediate conductor 775-*a*) and a gate portion formed at least in part by one or more respective conductors 786-*a*. The conductors 786-*a* may extend from one transistor 780-*a* to another, along a direction, such as the y-direction (e.g., along a row direction). In some examples, the pillars 770-*a* and 785-*a* may, collectively, involve a same pattern (e.g., along the x-direction, along the y-direction) as the pillars 760-*a*, but positioned on a different level 705 (e.g., along the z-direction), and implemented in accordance with different gate arrangements and biasing. Although transistors 565-*b* and 780-*a* are illustrated as being associated with a level 705-*a* that is above a level 705-*a* that is associated the transistors 560-*b*, such a relative arrangement may be swapped in some other examples.

The transistors 780-*a* may, in some examples, be activated according to various techniques to support the operation of the memory structure 700. In some examples, the transistors may be configured in an "always on" configuration, where the conductors 786-*a* may be activated whenever power or voltage is applied to or provided to the memory structure 700, or whenever the memory structure 700 is operable for supporting access operations (e.g., operating in an active mode). In some examples, the transistors 780-*a* may be configured to be activated during an access of the memory array 110-*c*-1, or the memory array 110-*c*-2, or both. In some examples, the transistors 780-*a* may be activated when a corresponding memory array 110-*c* is selected for an access operation, in which case the corresponding transistors 550-*b* and the corresponding transistors 780-*a* may both be activated (e.g., activating the transistors 550-*b*-11 and 780-*a*-1, and the respective repeated transistors along the y-direction, during access of the memory array 110-*c*-1). In some examples, such a combined or concurrent activation may be performed using a deck decoder, among other circuitry. Although the example of memory structure 700 includes the transistors 780-*a*, in some examples, the transistors 780-*a* may be replaced with metal conductors (e.g., vias, sockets, TSVs) that electrically connect the signal line conductors 735-*a* with the respective intermediate conductors 775-*a*, or the intermediate conductors 775-*a* may be extended (e.g., along the x-direction) to be directly connected with the signal line conductors 735-*a* (e.g., where the signal line conductors 735-*a* may include horizontal portions that are coincident with top and bottom ends of pillars 770-*a*).

In various examples, each of the pillars 715, 740, 755, 760, 770, and 785 may be operable to support at least a portion of a channel of a respective transistor (e.g., a channel or operable conductive path aligned along the z-direction, supporting an electrical coupling or conductive path between source and drain terminals based at least in part on a voltage of a respective gate portion, gate terminal, or gate conductor), and may include one or more doped semiconductor portions. For example, to support an n-type transistor, such pillars may include at least a p-type semiconductor portion, or may include a stack (e.g., along the z-direction) of an n-type semiconductor, a p-type semiconductor, and an n-type semiconductor (e.g., in an NPN arrangement along the z-direction), among other constituent materials or arrangements. To support a p-type transistor, such pillars may include at least an n-type semiconductor portion, or may include a stack (e.g., along the z-direction) of a p-type semiconductor, an n-type semiconductor, and a p-type semiconductor (e.g., in an PNP arrangement along the z-direction), among other constituent materials or arrangements. In some examples, a pillar as described herein may include one or more electrode portions, such as an electrode at one or both ends of the pillar (e.g., a top end, a bottom end, or both).

Each of the pillars 715, 740, 755, 760, 770, and 785 may be associated with a height or a height dimension relative to the substrate (e.g., a lower extent in the z-direction, an upper extent in the z-direction, a span in the z-direction), which may be defined as part of balancing various performance criteria of the memory arrays 110. In some examples, a height dimension or extent along the z-direction of pillars associated with a same level 705 may be equal or at least partially overlapping. For example, various combinations of the pillars 715, 740, 755, or 760 that are associated with the level 705-*a*-1, or the pillars 715, 740, 755, 770, or 785 that are associated with the level 705-*a*-2, or both may have a common height dimension (e.g., a common upper extent, a common lower extent, or both) relative to the substrate. In some examples, the pillars 715 may have a height or a height dimension that is different than other pillars, such as the pillars 715 having an extended height along the z-direction to support one or more features of the capacitors 220. The pillars 715, 740, 755, 760, 770, and 785 may be formed with various cross-sectional shapes (e.g., in an xy-plane), such as a square shape, a rectangular shape, a circular shape, an oval shape, or a polygonal shape, among others, where pillars 715, 740, 755, 760, 770, and 785 may have common or different shapes, or common or different dimensions.

The pillars 715, 740, 755, 760, 770, and 785 may be formed according to various techniques. In some examples, one or more layers or stacks of layers of doped semiconductor material may be deposited on or above a substrate (e.g., on or in contact with a digit line conductor 710, a ground conductor 765, or an intermediate conductor 775, or corresponding metal layer), and portions of the deposited layers located between respective pillars (e.g., along the x-direction, along the y-direction) may be etched away or trenched to form the respective pillars. In some examples, combinations of pillars 715, 740, 755, 760, 770, and 785 of a same level 705 may be formed from the same material or combination of materials (e.g., from a same layer or stack of layers, to support a common type of transistor channel). In some examples, such layers may include one or more electrode layers, such as an electrode layer above a stack of doped semiconductor material layers, an electrode layer below a stack of doped semiconductor material layers, or both, and such electrode layers may be or may not be etched or trenched along with the pillar formation processes. Additionally or alternatively, in some examples, holes or trenches may be etched through a material (e.g., in the z-direction, through a dielectric material, through a gate dielectric material) and material for the pillars 715, 740, 755, 760, 770, and 785 (e.g., one or more doped semiconductor materials, one or more electrode materials) may be deposited in the etched holes or trenches. In examples where pillar material is deposited into holes, trenches, or other recesses, pillars 715, 740, 755, 760, 770, and 785 of a same level 705 may be formed from a same material or combination of materials (e.g., using common material deposition operations), or may be formed from different materials or combinations of materials (e.g., using different material deposition operations, which may support transistors having different channel types).

In various examples, a quantity or configuration of pillars 715, 740, 755, 760, 770, and 785 for a respective transistor may be defined or chosen for particular characteristics, such as an associated drive strength (e.g., drive current), impedance, activation threshold, or leakage characteristic of a particular transistor or set of transistors. In some examples, multiple pillars may be described as or configured as parallel physical structures (e.g., parallel channels) of a common transistor or transistor component. For example, as illustrated, each of the transistors 550-*b* may include or be otherwise formed with two pillars 740-*a*, each of the transistors 555-*b* may include or be otherwise formed with two pillars 755-*a*, and so on. However, in other examples, each of such transistors may include or be otherwise formed with any quantity of one or more pillars respectively. Likewise, in various examples, a capacitor 220 may be formed with or over any quantity of one or more pillars 715. In some examples, each pillar of a set that is configured in parallel (e.g., commonly activated) may be described as or configured as a component of single transistor, such that a corresponding cell selection, deck selection, or deck shunting may be described as or configured as having multiple transistors in a parallel arrangement.

In some examples, various combinations of gate conductors (e.g., word line conductors 720-*a*, conductors 741-*a*, conductors 756-*a*, conductors 761-*a*, conductors 771-*a*, conductors 786-*a*) of a given level 705-*a* may be formed using one or more common operations, one or more common materials, or otherwise share various aspects of formation or configuration. For example, such gate conductors may be formed using one or more common conductor formation processes (e.g., a common masking process, a common etching process, a common deposition process, or various combinations thereof). In some examples, such gate conductors may be formed with a height dimension that is within or overlapping with a height dimension of at least doped semiconductor portions of the pillars corresponding pillars.

In various examples, gate conductors (e.g., word line conductors 720-*a*, conductors 741-*a*, conductors 756-*a*, conductors 761-*a*, conductors 771-*a*, conductors 786-*a*) may be formed from a metal or metal alloy (e.g., copper, tungsten, gold, silver, tin, aluminum, or alloys thereof). Such conductors may be separated from corresponding pillars (along the x-direction, along the y-direction, along the x-direction and the y-direction, along a radial direction) by a gate dielectric that is in contact with portions of the conductor and the respective pillar. In some examples, gate conductors may be located alongside the respective pillars (e.g., as a transverse gate, as a pass-by gate, as a pair of gate conductors on either or both sides of a pillar), including conductors extending between the pillars along the y-direction and separated from pillars along the x-direction by a gate dielectric. In some examples, gate conductors may include at least a portion that wraps (e.g., partially, entirely) around respective pillars (e.g., as a wrap-around gate, as a circumferential gate, as a concentric gate, as an all-around gate), where at least the respective pillars may be wrapped (e.g., partially wrapped, entirely wrapped) with a circumferential gate dielectric that is in contact with the pillar and the conductor. In various examples, the digit line conductors 710-*a*, signal line conductors 735-*a*, ground conductors 765-*a*, and intermediate conductors 775-*a*, among other components such as conductors, may be formed from a metal or metal alloy, which may be a same material or a different material as conductors used to support transistor gate portions (e.g., gate conductors).

In some examples, circuitry of a deck decoder (not shown), a column decoder 745-*a*, or the sense component 150-*c*, or any combination thereof may be substrate-based, such as including transistors formed at least in part by a doped portion of the substrate 420-*a* (e.g., in accordance with the transistor structure 400, transistors configured in a CMOS arrangement). By including the transistors 550-*a*, 555-*a*, 560-*a*, and 570-*a* in locations above the substrate 420-*a* (e.g., in multiple levels 705-*a*), the memory structure 700 may support improved flexibility for distributing signal development circuitry throughout a memory die, which may improve area utilization, or semiconductor substrate material utilization, among other benefits.

Figure 8:
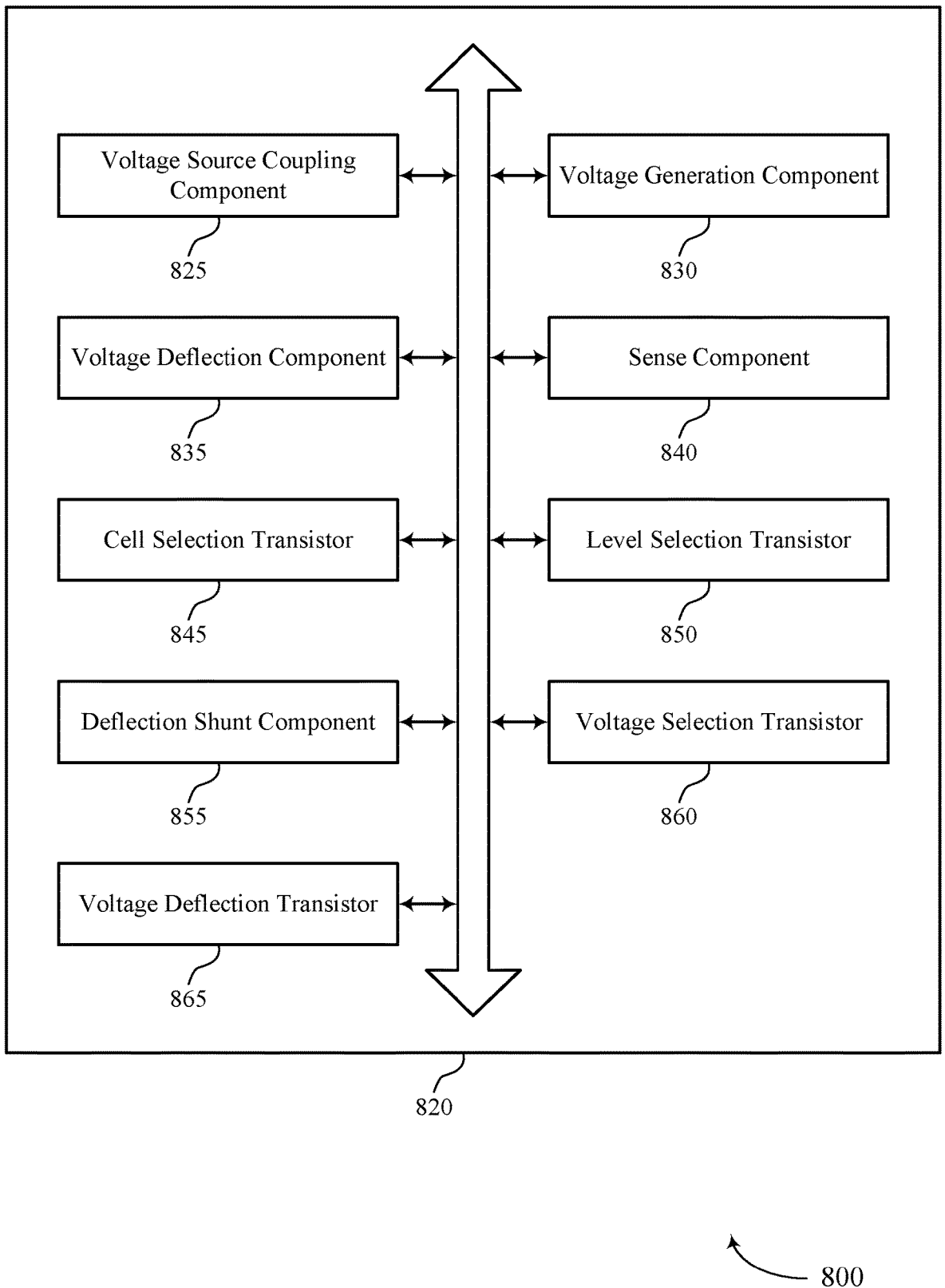
FIG. 8 shows a block diagram of a memory device that supports signal development circuitry layouts in a memory device in accordance with examples as disclosed herein.

FIG. 8 shows a block diagram 800 of a memory device 820 that supports signal development circuitry layouts in a memory device in accordance with examples as disclosed herein. The memory device 820 may be an example of aspects of a memory device as described with reference to FIGS. 1 through 7. The memory device 820, or various components thereof, may be an example of means for performing various aspects of signal development circuitry layouts as described herein. For example, the memory device 820 may include a voltage source coupling component 825, a voltage generation component 830, a voltage deflection component 835, a sense component 840, a cell selection transistor 845, a level selection transistor 850, a deflection shunt component 855, a voltage selection transistor 860, a voltage deflection transistor 865, or any combination thereof. Each of these components may communicate, directly or indirectly, with one another (e.g., via one or more buses).

The voltage source coupling component 825 may be configured as or otherwise support a means for isolating a conductor of a memory die from a voltage source based at least in part on deactivating a first transistor that is associated with a first level of the memory die above a substrate. The voltage generation component 830 may be configured as or otherwise support a means for generating a first voltage at the conductor of the memory die based at least in part on coupling a storage element of a memory cell with a digit line and coupling the digit line with the conductor. The voltage deflection component 835 may be configured as or otherwise support a means for shifting the conductor from the first voltage to a second voltage based at least in part on shifting a bias applied to a gate of a second transistor that is associated with a second level of the memory die above the substrate from a third voltage to a fourth voltage, the second transistor having a channel portion coupled between a first portion of the conductor and a second portion of the conductor. The sense component 840 may be configured as or otherwise support a means for determining a logic state based at least in part on the voltage deflection component 835 shifting the conductor from the first voltage to the second voltage.

In some examples, coupling the storage element of the memory cell with the digit line may be based at least in part on the voltage generation component 830 activating a first channel associated with one or more first semiconductor pillars of the memory die that are coupled between the storage element and the digit line. In some examples, coupling the digit line with the conductor may be based at least in part on the voltage generation component 830 activating a second channel associated with one or more second semiconductor pillars of the memory die that are coupled between the digit line and the conductor, where the one or more second semiconductor pillars are overlapping, along a height dimension relative to the substrate, with the one or more first semiconductor pillars.

In some examples, deactivating the first transistor may be based at least in part on the voltage source coupling component 825 deactivating a third channel associated with one or more third semiconductor pillars of the memory die that are coupled between the conductor and the voltage source, where the one or more third semiconductor pillars are overlapping, along the height dimension relative to the substrate, with the one or more first semiconductor pillars.

In some examples, the channel portion of the second transistor is associated with one or more fourth semiconductor pillars of the memory die that are overlapping, along the height dimension relative to the substrate, with the one or more first semiconductor pillars.

In some examples, a first end of the channel portion of the second transistor is coupled with first conductor, and the deflection shunt component 855 may be configured as or otherwise support a means for activating a fifth transistor that is associated with the second level of the memory die, the fifth transistor having a channel portion coupled between a second end of the channel portion of the second transistor and the conductor. In some examples, a first end of the channel portion of the second transistor may be coupled with the conductor and a second end of the channel portion of the second transistor may be coupled with the conductor.

In some examples, the voltage source is associated with a ground voltage.

In some examples, the voltage source coupling component 825 may be configured as or otherwise support a means for isolating a second conductor of the memory die from the voltage source based at least in part on deactivating a third transistor that is associated with the first level of the memory die. In some examples, the voltage generation component 830 may be configured as or otherwise support a means for generating a fifth voltage at the second conductor of the memory die based at least in part on coupling a storage element of a second memory cell with a second digit line and coupling the second digit line with the second conductor. In some examples, the voltage deflection component 835 may be configured as or otherwise support a means for shifting the second conductor from the fifth voltage to a sixth voltage based at least in part on shifting a bias applied to a gate of a fourth transistor that is associated with the second level of the memory die from a seventh voltage to an eighth voltage, the fourth transistor having a channel portion coupled between a first portion of the second conductor and a second portion of the second conductor. In some examples, the sense component 840 may be configured as or otherwise support a means for where determining the logic state is based at least in part on the voltage deflection component 835 shifting the second conductor from the fifth voltage to the sixth voltage.

In some examples, determining the logic state is based at least in part on comparing the second voltage with the sixth voltage.

Figure 9:
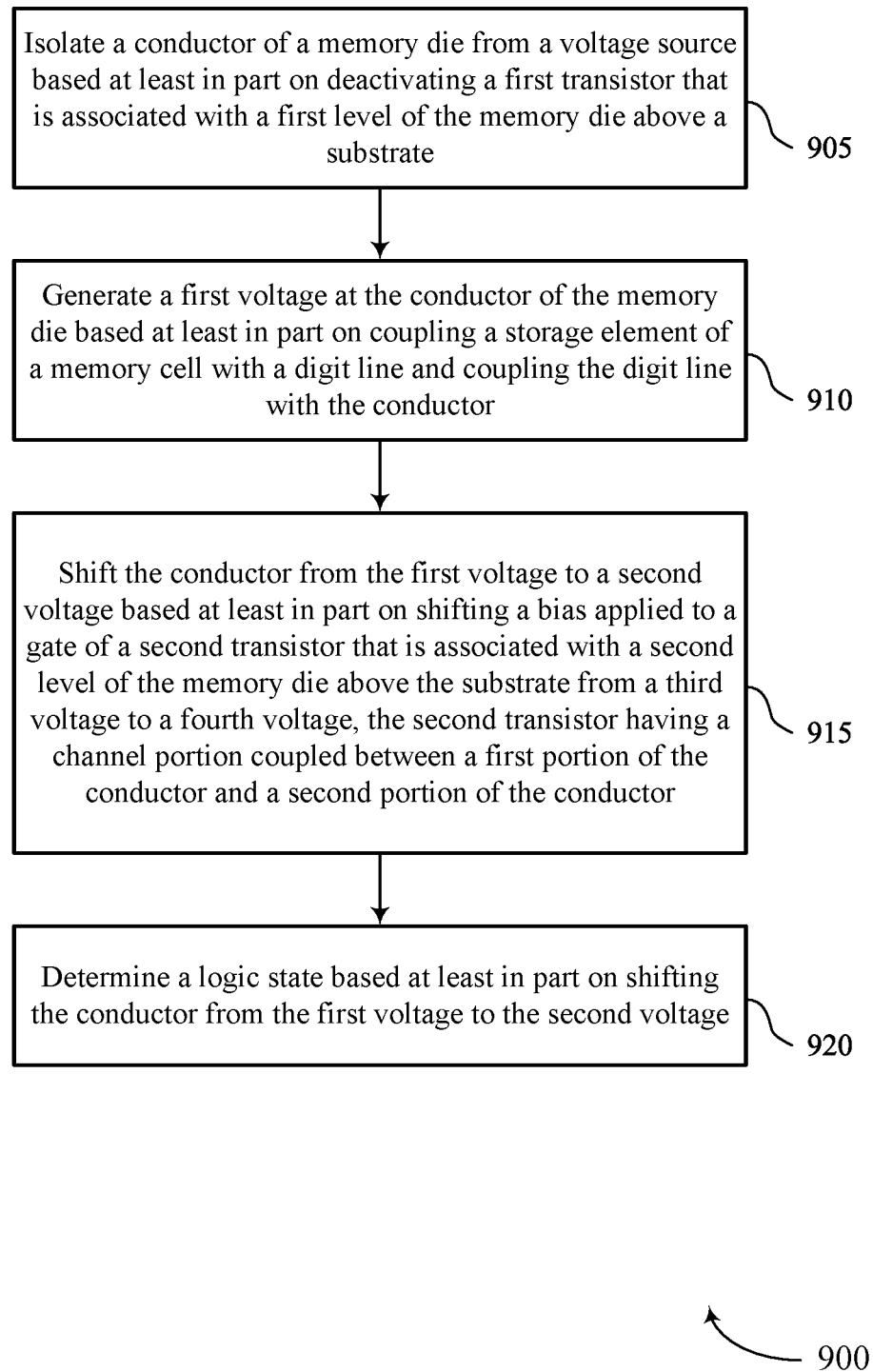
FIG. 9 shows a flowchart illustrating a method or methods that support signal development circuitry layouts in a memory device in accordance with examples as disclosed herein.

FIG. 9 shows a flowchart illustrating a method 900 that supports signal development circuitry layouts in a memory device in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include isolating a conductor of a memory die from a voltage source based at least in part on deactivating a first transistor that is associated with a first level of the memory die above a substrate. The operations of 905 may be performed in accordance with examples as disclosed herein. In some examples, aspects of the operations of 905 may be performed by a voltage source coupling component 825 as described with reference to FIG. 8.

At 910, the method may include generating a first voltage at the conductor of the memory die based at least in part on coupling a storage element of a memory cell with a digit line and coupling the digit line with the conductor. The operations of 910 may be performed in accordance with examples as disclosed herein. In some examples, aspects of the operations of 910 may be performed by a voltage generation component 830 as described with reference to FIG. 8.

At 915, the method may include shifting the conductor from the first voltage to a second voltage based at least in part on shifting a bias applied to a gate of a second transistor that is associated with a second level of the memory die above the substrate from a third voltage to a fourth voltage, the second transistor having a channel portion coupled between a first portion of the conductor and a second portion of the conductor. The operations of 915 may be performed in accordance with examples as disclosed herein. In some examples, aspects of the operations of 915 may be performed by a voltage deflection component 835 as described with reference to FIG. 8.

At 920, the method may include determining a logic state based at least in part on shifting the conductor from the first voltage to the second voltage. The operations of 920 may be performed in accordance with examples as disclosed herein. In some examples, aspects of the operations of 920 may be performed by a sense component 840 as described with reference to FIG. 8.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for isolating a conductor of a memory die from a voltage source based at least in part on deactivating a first transistor that is associated with a first level of the memory die above a substrate; generating a first voltage at the conductor of the memory die based at least in part on coupling a storage element of a memory cell with a digit line and coupling the digit line with the conductor; shifting the conductor from the first voltage to a second voltage based at least in part on shifting a bias applied to a gate of a second transistor that is associated with a second level of the memory die above the substrate from a third voltage to a fourth voltage, the second transistor having a channel portion coupled between a first portion of the conductor and a second portion of the conductor; and determining a logic state based at least in part on shifting the conductor from the first voltage to the second voltage.

Aspect 2: The method, apparatus, or non-transitory computer-readable medium of aspect 1 where coupling the storage element of the memory cell with the digit line is based at least in part on activating a first channel associated with one or more first semiconductor pillars of the memory die that are coupled between the storage element and the digit line, and coupling the digit line with the conductor is based at least in part on activating a second channel associated with one or more second semiconductor pillars of the memory die that are coupled between the digit line and the conductor, where the one or more second semiconductor pillars are overlapping, along a height dimension relative to the substrate, with the one or more first semiconductor pillars.

Aspect 3: The method, apparatus, or non-transitory computer-readable medium of aspect 2 where deactivating the first transistor is based at least in part on deactivating a third channel associated with one or more third semiconductor pillars of the memory die that are coupled between the conductor and the voltage source, where the one or more third semiconductor pillars are overlapping, along the height dimension relative to the substrate, with the one or more first semiconductor pillars.

Aspect 4: The method, apparatus, or non-transitory computer-readable medium of any of aspects 2 through 3 where the channel portion of the second transistor is associated with one or more fourth semiconductor pillars of the memory die that are overlapping, along the height dimension relative to the substrate, with the one or more first semiconductor pillars.

Aspect 5: The method, apparatus, or non-transitory computer-readable medium of any of aspects 1 through 4 where a first end of the channel portion of the second transistor is coupled with first conductor and the method, apparatuses, and non-transitory computer-readable medium, further includes operations, features, circuitry, logic, means, or instructions, or any combination thereof for activating a fifth transistor that is associated with the second level of the memory die, the fifth transistor having a channel portion coupled between a second end of the channel portion of the second transistor and the conductor.

Aspect 6: The method, apparatus, or non-transitory computer-readable medium of any of aspects 1 through 4 where a first end of the channel portion of the second transistor is coupled with the conductor and a second end of the channel portion of the second transistor is coupled with the conductor.

Aspect 7: The method, apparatus, or non-transitory computer-readable medium of any of aspects 1 through 6 where the voltage source is associated with a ground voltage.

Aspect 8: The method, apparatus, or non-transitory computer-readable medium of any of aspects 1 through 7, further including operations, features, circuitry, logic, means, or instructions, or any combination thereof for isolating a second conductor of the memory die from the voltage source based at least in part on deactivating a third transistor that is associated with the first level of the memory die; generating a fifth voltage at the second conductor of the memory die based at least in part on coupling a storage element of a second memory cell with a second digit line and coupling the second digit line with the second conductor; shifting the second conductor from the fifth voltage to a sixth voltage based at least in part on shifting a bias applied to a gate of a fourth transistor that is associated with the second level of the memory die from a seventh voltage to an eighth voltage, the fourth transistor having a channel portion coupled between a first portion of the second conductor and a second portion of the second conductor; and where determining the logic state is based at least in part on shifting the second conductor from the fifth voltage to the sixth voltage.

Aspect 9: The method, apparatus, or non-transitory computer-readable medium of aspect 8 where determining the logic state is based at least in part on comparing the second voltage with the sixth voltage.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 10: An apparatus, including: a first digit line associated with a first level of a memory die above a substrate, the first digit line associated with (e.g., coupled with, coupled with cell selection components of) a first set of memory cells of the memory die; a second digit line associated with a second level of the memory die above the substrate, the second digit line associated with (e.g., coupled with, coupled with cell selection components of) a second set of memory cells of the memory die; a first transistor associated with the first level of the memory die and operable to couple the first digit line with a first conductor that is coupled with a sense amplifier of the memory die; a second transistor associated with the second level of the memory die and operable to couple the second digit line with the first conductor; a third transistor associated with the first level of the memory die and operable to couple the first conductor with a voltage source; and a fourth transistor associated with the second level of the memory die and having a channel portion coupled with (e.g., coupled between, electrically, physically) the first conductor and a second conductor.

Aspect 11: The apparatus of aspect 10, further including: a fifth transistor associated with the second level of the memory die and operable to couple the first conductor with the second conductor.

Aspect 12: The apparatus of aspect 10, where the second conductor is connected with the first conductor via a metal portion associated with the second level of the memory die.

Aspect 13: The apparatus of any of aspects 10 through 12, where the second conductor and the second digit line are overlapping along a height dimension relative to the substrate.

Aspect 14: The apparatus of any of aspects 10 through 13, where: a channel portion of the first transistor includes a set of one or more first semiconductor pillars in contact with the first digit line and the first conductor; and a channel portion of the second transistor includes a set of one or more second semiconductor pillars in contact with the second digit line and the first conductor.

Aspect 15: The apparatus of aspect 14, where: a channel portion of the third transistor includes a set of one or more third semiconductor pillars in contact with the first conductor and overlapping, along a height dimension relative to the substrate, with the set of one or more first semiconductor pillars; and the channel portion of the fourth transistor includes a set of one or more fourth semiconductor pillars in contact with the first conductor and overlapping, along the height dimension relative to the substrate, with the set of one or more second semiconductor pillars.

Aspect 16: The apparatus of any of aspects 14 through 15, where: each first memory cell of the first set of memory cells is associated with a respective first cell selection transistor, where a channel portion of each first cell selection transistor includes a respective set of one or more fifth semiconductor pillars in contact with the first digit line and overlapping, along a height dimension relative to the substrate, with the set of one or more first semiconductor pillars; and each second memory cell of the second set of memory cells is associated with a respective second cell selection transistor, where a channel portion of each second cell selection transistor includes a respective set of one or more sixth semiconductor pillars in contact with the second digit line and overlapping, along the height dimension relative to the substrate, with the set of one or more second semiconductor pillars.

Aspect 17: The apparatus of any of aspects 10 through 16, further including: a third digit line associated with the first level of the memory die, the third digit line coupled with a third set of memory cells of the memory die; a fourth digit line associated with the second level of the memory die, the fourth digit line coupled with a fourth set of memory cells of the memory die; a fifth transistor associated with the first level of the memory die and operable to couple the third digit line with a third conductor that is coupled with the sense amplifier; a sixth transistor associated with the second level of the memory die and operable to couple the fourth digit line with the second conductor; a seventh transistor associated with the first level of the memory die and operable to couple the second conductor with a second voltage source; and an eighth transistor associated with the second level of the memory die and having a channel portion coupled between the third conductor and a fourth conductor.

Aspect 18: The apparatus of aspect 17, where the sense amplifier is operable to detect a logic state based at least in part on a voltage of the first conductor and a voltage of the third conductor.

Aspect 19: The apparatus of any of aspects 10 through 18, where the sense amplifier includes a plurality of transistors, each transistor of the plurality of transistors including a respective channel portion formed at least in part by a doped portion of the substrate.

Aspect 20: The apparatus of any of aspects 10 through 19, where the voltage source is associated with a ground voltage.

An apparatus is described. The following provides an overview of aspects of the apparatus as described herein:

Aspect 21: An apparatus, including: a memory die including a first level above a substrate and a second level above the substrate; and circuitry of the memory die operable to cause the apparatus to: isolate a conductor of the memory die from a voltage source based at least in part on deactivating a first transistor that is associated with the first level of the memory die; generate a first voltage at the conductor of the memory die based at least in part on coupling a storage element of a memory cell with a digit line and coupling the digit line with the conductor; shift the conductor from the first voltage to a second voltage based at least in part on shifting a bias applied to a gate of a second transistor that is associated with the second level of the memory die from a third voltage to a fourth voltage, the second transistor having a channel portion coupled with (e.g., coupled between, electrically, physically) a first portion of the conductor and a second portion of the conductor; and determine a logic state based at least in part on shifting the conductor from the first voltage to the second voltage.

Aspect 22: The apparatus of aspect 21, where the circuitry is operable to cause the apparatus to: couple the storage element of the memory cell with the digit line based at least in part on activating a first channel associated with one or more first semiconductor pillars of the memory die that are coupled between the storage element and the digit line; and couple the digit line with the conductor based at least in part on activating a second channel associated with one or more second semiconductor pillars of the memory die that are coupled between the digit line and the conductor, where the one or more second semiconductor pillars are overlapping, along a height dimension relative to the substrate, with the one or more first semiconductor pillars.

Aspect 23: The apparatus of aspect 22, where the circuitry is operable to cause the apparatus to: deactivate the first transistor is based at least in part on deactivating a third channel associated with one or more third semiconductor pillars of the memory die that are coupled between the conductor and the voltage source, where the one or more third semiconductor pillars are overlapping, along the height dimension relative to the substrate, with the one or more first semiconductor pillars.

Aspect 24: The apparatus of any of aspects 22 through 23, where: the channel portion of the second transistor is associated with one or more fourth semiconductor pillars of the memory die that are overlapping, along the height dimension relative to the substrate, with the one or more first semiconductor pillars.

Aspect 25: The apparatus of any of aspects 22 through 24, where the circuitry is operable to cause the apparatus to: isolate a second conductor of the memory die from the voltage source based at least in part on deactivating a third transistor that is associated with the first level of the memory die; generate a fifth voltage at the second conductor of the memory die based at least in part on coupling a storage element of a second memory cell with a second digit line and coupling the second digit line with the second conductor; shift the second conductor from the fifth voltage to a sixth voltage based at least in part on shifting a bias applied to a gate of a fourth transistor that is associated with the second level of the memory die from a seventh voltage to an eighth voltage, the fourth transistor having a channel portion coupled between a first portion of the second conductor and a second portion of the second conductor; and determine the logic state based at least in part on shifting the second conductor from the fifth voltage to the sixth voltage.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected with other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a first digit line associated with a first level of a memory die above a substrate, the first digit line coupled with a first set of memory cells of the memory die;
a second digit line associated with a second level of the memory die above the substrate, the second digit line coupled with a second set of memory cells of the memory die;
a first transistor associated with the first level of the memory die and operable to couple the first digit line with a first conductor that is coupled with a sense amplifier of the memory die;
a second transistor associated with the second level of the memory die and operable to couple the second digit line with the first conductor;
a third transistor associated with the first level of the memory die and operable to couple the first conductor with a voltage source; and
a fourth transistor associated with the second level of the memory die and having a channel portion coupled between the first conductor and a second conductor.

2. The apparatus of claim 1, further comprising:
a fifth transistor associated with the second level of the memory die and operable to couple the first conductor with the second conductor.

3. The apparatus of claim 1, wherein the second conductor is connected with the first conductor via a metal portion associated with the second level of the memory die.

4. The apparatus of claim 1, wherein the second conductor and the second digit line are overlapping along a height dimension relative to the substrate.

5. The apparatus of claim 1, wherein:
a channel portion of the first transistor comprises a set of one or more first semiconductor pillars in contact with the first digit line and the first conductor; and
a channel portion of the second transistor comprises a set of one or more second semiconductor pillars in contact with the second digit line and the first conductor.

6. The apparatus of claim 5, wherein:
a channel portion of the third transistor comprises a set of one or more third semiconductor pillars in contact with the first conductor and overlapping, along a height dimension relative to the substrate, with the set of one or more first semiconductor pillars; and
the channel portion of the fourth transistor comprises a set of one or more fourth semiconductor pillars in contact with the first conductor and overlapping, along the height dimension relative to the substrate, with the set of one or more second semiconductor pillars.

7. The apparatus of claim 5, wherein:
each first memory cell of the first set of memory cells is associated with a respective first cell selection transistor, wherein a channel portion of each first cell selection transistor comprises a respective set of one or more fifth semiconductor pillars in contact with the first digit line and overlapping, along a height dimension relative to the substrate, with the set of one or more first semiconductor pillars; and
each second memory cell of the second set of memory cells is associated with a respective second cell selection transistor, wherein a channel portion of each second cell selection transistor comprises a respective set of one or more sixth semiconductor pillars in contact with the second digit line and overlapping, along the height dimension relative to the substrate, with the set of one or more second semiconductor pillars.

8. The apparatus of claim 1, further comprising:
a third digit line associated with the first level of the memory die, the third digit line coupled with a third set of memory cells of the memory die;
a fourth digit line associated with the second level of the memory die, the fourth digit line coupled with a fourth set of memory cells of the memory die;
a fifth transistor associated with the first level of the memory die and operable to couple the third digit line with a third conductor that is coupled with the sense amplifier;
a sixth transistor associated with the second level of the memory die and operable to couple the fourth digit line with the second conductor;
a seventh transistor associated with the first level of the memory die and operable to couple the second conductor with a second voltage source; and
an eighth transistor associated with the second level of the memory die and having a channel portion coupled between the third conductor and a fourth conductor.

9. The apparatus of claim 8, wherein the sense amplifier is operable to detect a logic state based at least in part on a voltage of the first conductor and a voltage of the third conductor.

10. The apparatus of claim 1, wherein the sense amplifier comprises a plurality of transistors, each transistor of the plurality of transistors comprising a respective channel portion formed at least in part by a doped portion of the substrate.

11. The apparatus of claim 1, wherein the voltage source is associated with a ground voltage.

12. A method, comprising:
isolating a conductor of a memory die from a voltage source based at least in part on deactivating a first transistor that is associated with a first level of the memory die above a substrate;

generating a first voltage at the conductor of the memory die based at least in part on coupling a storage element of a memory cell with a digit line and coupling the digit line with the conductor;

shifting the conductor from the first voltage to a second voltage based at least in part on shifting a bias applied to a gate of a second transistor that is associated with a second level of the memory die above the substrate from a third voltage to a fourth voltage, the second transistor having a channel portion coupled between a first portion of the conductor and a second portion of the conductor; and determining a logic state based at least in part on shifting the conductor from the first voltage to the second voltage.

13. The method of claim 12, wherein:

coupling the storage element of the memory cell with the digit line is based at least in part on activating a first channel associated with one or more first semiconductor pillars of the memory die that are coupled between the storage element and the digit line; and coupling the digit line with the conductor is based at least in part on activating a second channel associated with one or more second semiconductor pillars of the memory die that are coupled between the digit line and the conductor, wherein the one or more second semiconductor pillars are overlapping, along a height dimension relative to the substrate, with the one or more first semiconductor pillars.

14. The method of claim 13, wherein deactivating the first transistor is based at least in part on deactivating a third channel associated with one or more third semiconductor pillars of the memory die that are coupled between the conductor and the voltage source, wherein the one or more third semiconductor pillars are overlapping, along the height dimension relative to the substrate, with the one or more first semiconductor pillars.

15. The method of claim 13, wherein the channel portion of the second transistor is associated with one or more fourth semiconductor pillars of the memory die that are overlapping, along the height dimension relative to the substrate, with the one or more first semiconductor pillars.

16. The method of claim 12, wherein a first end of the channel portion of the second transistor is coupled with the conductor, the method further comprising:

activating a fifth transistor that is associated with the second level of the memory die, the fifth transistor having a channel portion coupled between a second end of the channel portion of the second transistor and the conductor.

17. The method of claim 12, wherein a first end of the channel portion of the second transistor is coupled with the conductor and a second end of the channel portion of the second transistor is coupled with the conductor.

18. The method of claim 12, wherein the voltage source is associated with a ground voltage.

19. The method of claim 12, further comprising:

isolating a second conductor of the memory die from the voltage source based at least in part on deactivating a third transistor that is associated with the first level of the memory die;

generating a fifth voltage at the second conductor of the memory die based at least in part on coupling a storage element of a second memory cell with a second digit line and coupling the second digit line with the second conductor; and shifting the second conductor from the fifth voltage to a sixth voltage based at least in part on shifting a bias applied to a gate of a fourth transistor that is associated with the second level of the memory die from a seventh voltage to an eighth voltage, the fourth transistor having a channel portion coupled between a first portion of the second conductor and a second portion of the second conductor, wherein determining the logic state is based at least in part on shifting the second conductor from the fifth voltage to the sixth voltage.

20. The method of claim 19, wherein determining the logic state is based at least in part on comparing the second voltage with the sixth voltage.

21. An apparatus, comprising:

a memory die comprising a first level above a substrate and a second level above the substrate; and circuitry of the memory die operable to cause the apparatus to:

isolate a conductor of the memory die from a voltage source based at least in part on deactivating a first transistor that is associated with the first level of the memory die;

generate a first voltage at the conductor of the memory die based at least in part on coupling a storage element of a memory cell with a digit line and coupling the digit line with the conductor;

shift the conductor from the first voltage to a second voltage based at least in part on shifting a bias applied to a gate of a second transistor that is associated with the second level of the memory die from a third voltage to a fourth voltage, the second transistor having a channel portion coupled between a first portion of the conductor and a second portion of the conductor; and determine a logic state based at least in part on shifting the conductor from the first voltage to the second voltage.

22. The apparatus of claim 21, wherein the circuitry is operable to cause the apparatus to:

couple the storage element of the memory cell with the digit line based at least in part on activating a first channel associated with one or more first semiconductor pillars of the memory die that are coupled between the storage element and the digit line; and couple the digit line with the conductor based at least in part on activating a second channel associated with one or more second semiconductor pillars of the memory die that are coupled between the digit line and the conductor, wherein the one or more second semiconductor pillars are overlapping, along a height dimension relative to the substrate, with the one or more first semiconductor pillars.

23. The apparatus of claim 22, wherein the circuitry is operable to cause the apparatus to:

deactivate the first transistor is based at least in part on deactivating a third channel associated with one or more third semiconductor pillars of the memory die that are coupled between the conductor and the voltage source, wherein the one or more third semiconductor pillars are overlapping, along the height dimension relative to the substrate, with the one or more first semiconductor pillars.

24. The apparatus of claim 22, wherein:
the channel portion of the second transistor is associated with one or more fourth semiconductor pillars of the memory die that are overlapping, along the height dimension relative to the substrate, with the one or more first semiconductor pillars.

25. The apparatus of claim 22, wherein the circuitry is operable to cause the apparatus to:
isolate a second conductor of the memory die from the voltage source based at least in part on deactivating a third transistor that is associated with the first level of the memory die;
generate a fifth voltage at the second conductor of the memory die based at least in part on coupling a storage element of a second memory cell with a second digit line and coupling the second digit line with the second conductor;
shift the second conductor from the fifth voltage to a sixth voltage based at least in part on shifting a bias applied to a gate of a fourth transistor that is associated with the second level of the memory die from a seventh voltage to an eighth voltage, the fourth transistor having a channel portion coupled between a first portion of the second conductor and a second portion of the second conductor; and
determine the logic state based at least in part on shifting the second conductor from the fifth voltage to the sixth voltage.

* * * * *